US012738318B2

(12) United States Patent
Joshua et al.

(10) Patent No.: US 12,738,318 B2
(45) Date of Patent: Sep. 15, 2026

(54) SGS VOLTAGE IN UNSELECTED BLOCKS DURING PROGRAM

(71) Applicant: Sandisk Technologies, Inc., Milpitas, CA (US)

(72) Inventors: Alvin Joshua, Fujisawa (JP); Yuki Kuniyoshi, Fujisawa (JP); Akitomo Nakayama, Yokohama (JP); Hayato Horie, Yokohama (JP); Hardwell Chibvongodze, Hiratsuka (JP)

(73) Assignee: Sandisk Technologies, Inc., Milpitas, CA (US)

( * ) Notice: Subject to any disclaimer, the term of this patent is extended or adjusted under 35 U.S.C. 154(b) by 132 days.

(21) Appl. No.: 18/905,292

(22) Filed: Oct. 3, 2024

(65) Prior Publication Data

US 2026/0100228 A1 Apr. 9, 2026

(51) Int. Cl.

| | |
|---|---|
| ***G11C 16/10*** | (2006.01) |
| ***G11C 16/04*** | (2006.01) |
| ***G11C 16/08*** | (2006.01) |
| ***H10B 43/10*** | (2023.01) |
| ***H10B 43/27*** | (2023.01) |
| ***H10B 43/35*** | (2023.01) |
| ***H10W 90/00*** | (2026.01) |
| ***H10W 90/24*** | (2026.01) |

(52) U.S. Cl.

CPC .......... *G11C 16/10* (2013.01); *G11C 16/0483* (2013.01); *G11C 16/08* (2013.01); *H10B 43/10* (2023.02); *H10B 43/27* (2023.02); *H10B 43/35* (2023.02); *H10W 90/00* (2026.01); *H10W 90/24* (2026.01)

(58) Field of Classification Search

CPC ..... G11C 16/10; G11C 16/0483; G11C 16/08; H10B 43/10; H10B 43/27; H10B 43/35; H10W 90/00; H10W 90/24

See application file for complete search history.

(56) References Cited

U.S. PATENT DOCUMENTS

| | | | | |
|---|---|---|---|---|
| 7,876,618 | B2 | 1/2011 | Lee et al. | |
| 9,589,648 | B1 | 3/2017 | Maeda | |
| 9,653,175 | B2 | 5/2017 | Sabde et al. | |
| 11,881,271 | B2 | 1/2024 | Guo et al. | |
| 11,972,820 | B2 * | 4/2024 | Guo | G11C 16/10 |
| 2012/0147689 | A1 * | 6/2012 | Scheuerlein | H10B 69/00 365/230.03 |
| 2015/0085574 | A1 * | 3/2015 | Raghu | G11C 11/5628 365/185.11 |
| 2016/0027504 | A1 * | 1/2016 | Lee | G11C 16/14 365/185.03 |
| 2017/0249994 | A1 | 8/2017 | Hashimoto | |
| 2024/0379170 | A1 * | 11/2024 | Chen | G11C 16/08 |

* cited by examiner

*Primary Examiner* — Zhuo H Li

(74) *Attorney, Agent, or Firm* — Pearl Cohen LLP

(57) ABSTRACT

Technology for programing NAND memory. A memory system has control circuitry that applies a low voltage (e.g., VSS) to SGS lines in one or more unselected blocks that neighbor a block that has been selected for programming. This low voltage keeps source select transistors off, which cuts off the NAND channels in the neighbor unselected block(s) from the source line. The control circuit may float the SGS lines in other unselected blocks, which allows the source line voltage to ramp up quickly to provide for a faster programming operation.

20 Claims, 27 Drawing Sheets

Storage System 100
Memory Controller 120
102
Host
152
Host Interface
156
Processor
158
ECC Engine
160
Memory Interface
130
Storage
NOC
154
Local Memory Controller
164
Local Memory
140

207
211
201
memory structure 202
208
206
row decoder 222
array drivers 224
block select 226
row control circuitry 220
column control circuitry 210
column decoder 212
driver circuitry 214
block select 216
R/W Circuits 225
Control Die
row address signals
control signals
control signals
column address signals
System Control Logic 260
State Machine 262
Storage 266
Power Control 264
Interface 268
Memory Controller To NAND strings
BL3
BL2
BL1
BL0
225
225
225
225
325
Comparison circuit 320
Sense Node Latch 322
Managing Circuit 330
340
ADL
BDL
CDL
346
336
352
348
XDL
I/O Interface 332
334
Data

FIG. 4 set magnitude of initial Vpgm and set PC = 1
602
channel pre-charge
604
boost channels
606 apply program pulse
608
verify and lock out cells having reached target state
610
612
pass
status?
fail
614
616
status = pass
count failed cells
618
yes
failed bits ≤ predetermined limit?
no
620
624
no
PC<PL?
status = fail
yes
step Vpgm by ΔVpgm and increment PC
626 of memory cells
E
P
Vev
Vr
Vv
Vt

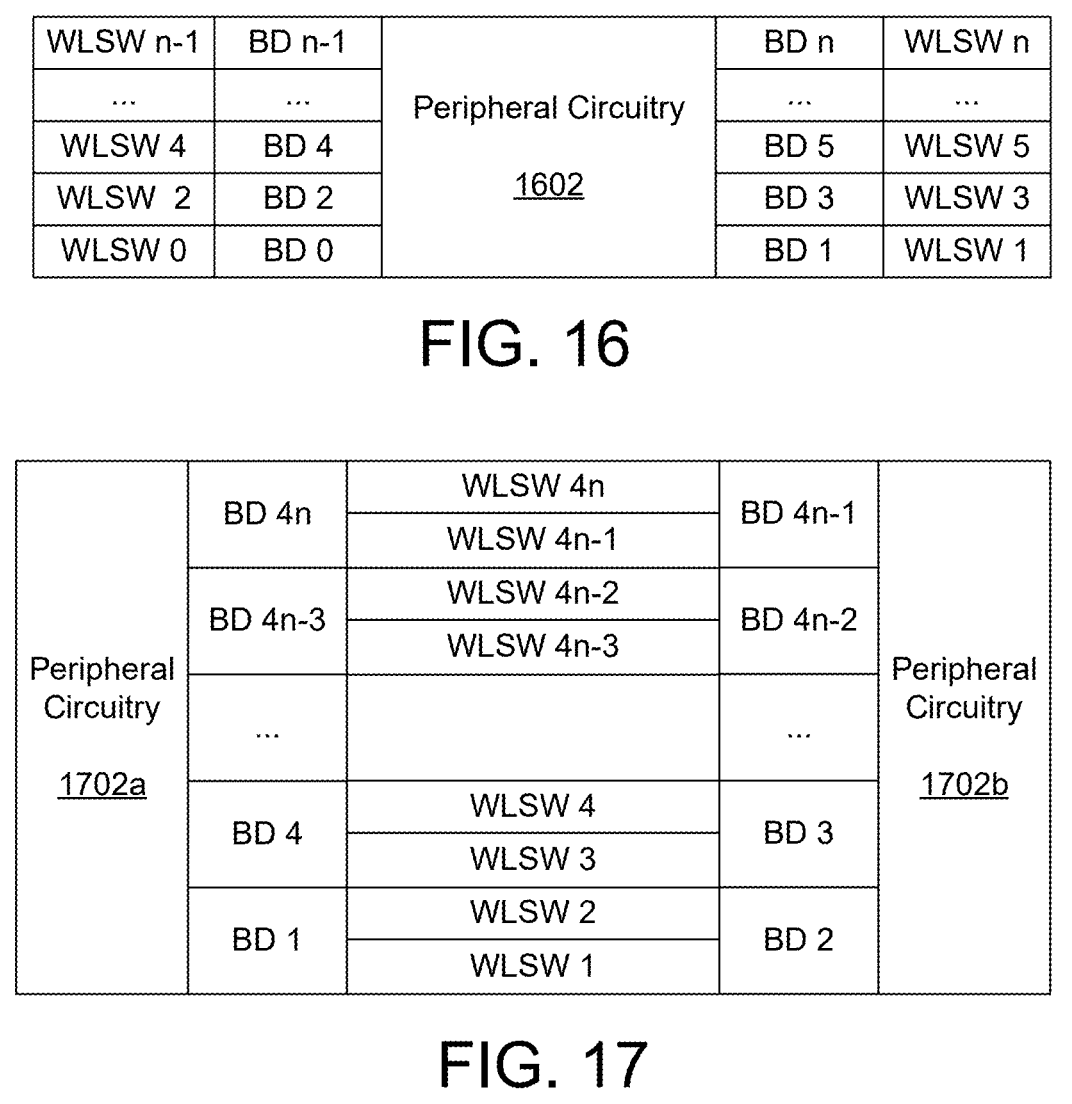

| WLSW n-1 | BD n-1 | Peripheral Circuitry 1602 | BD n | WLSW n |
|---|---|---|---|---|
| ... | ... | | ... | ... |
| WLSW 4 | BD 4 | | BD 5 | WLSW 5 |
| WLSW 2 | BD 2 | | BD 3 | WLSW 3 |
| WLSW 0 | BD 0 | | BD 1 | WLSW 1 |

FIG. 16

| Peripheral Circuitry 1702a | BD 4n | WLSW 4n | BD 4n-1 | Peripheral Circuitry 1702b |
|---|---|---|---|---|
| | | WLSW 4n-1 | | |
| | BD 4n-3 | WLSW 4n-2 | BD 4n-2 | |
| | | WLSW 4n-3 | | |
| | ... | | ... | |
| | BD 4 | WLSW 4 | BD 3 | |
| | | WLSW 3 | | |
| | BD 1 | WLSW 2 | BD 2 | |
| | | WLSW 1 | | |

FIG. 17

SGS VOLTAGE IN UNSELECTED BLOCKS DURING PROGRAM

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the physical block. The memory system may have a large number of blocks, with each block containing NAND strings and associated word lines. Each block could have over one hundred word lines and there may be thousands of blocks. Therefore, there may be a very large number of word lines in the memory system.

FIG. 1 is a schematic diagram of a portion of a conventional NAND memory structure. A portion of two adjacent blocks (BLKn, BLKn+1) are depicted. Each block has many NAND strings, however, only one NAND string is depicted in each block. NAND string 10 is depicted in BLKn, which has been selected for a program operation. NAND string 12 is depicted in BLKn+1, which is not selected (i.e., unselected) for the program operation. The two NAND strings are both connected to the same source line (SL) 16. In some NAND architectures, all of the blocks in a plane share the same source line. The two blocks are separated by a metal structure 14, which connects to the source line 16. Therefore, the metal structure 14 may be biased to the same voltage as the source line 16. Moreover, the metal structure 14 may provide electrical shielding between the two blocks.

Each block has control lines that connect to the control gates of the transistors on the NAND strings in that block. Memory cell transistors are connected to word lines (WL). Each end of the NAND strings are connected to select lines. Two drain select lines (SGDT, SGD) are depicted in each block. A drain select line is used to connect/disconnect a NAND channel to/from a bit line (bit lines not depicted in FIG. 1). Two source select lines (SGST, SGS) are depicted in each block. A source select line is used to connect/disconnect a NAND channel to/from the source line 16.

FIG. 1 shows example voltages applied to the control lines during program in the selected block BLKn. A program voltage Vpgm is applied to a selected word line in BLKn.

The remaining word lines in BLKn receive a boosting voltage (Vpass). The NAND string 10 in the selected block BLKn could be presently undergoing programming or could be inhibited from programming. In the selected block (BLKn), SGDT, SGD, SGST, SGS are provided with voltages that can either facilitate controlling the NAND channel potential to either facilitate or inhibit programming, depending on the voltage eon the bit line. The word lines in the unselected block BLKn+1 are floating during the programming in BLKn.

As noted, the metal structure 14 may be biased to the same voltage as the source line 16. Therefore, the metal structure 14 may provide electrical shielding between the two blocks. However, defects may occur during the fabrication of the metal structure 14. Such defects could result in all or part of a plane being inoperable.

BRIEF DESCRIPTION OF THE DRAWINGS

Like-numbered elements refer to common components in the different figures.

FIG. 4 is a perspective view of a portion of one example embodiment of a monolithic three dimensional memory structure.

FIG. 16 depicts an embodiment of a layout of control circuitry.

FIG. 17 depicts another embodiment of a layout of control circuitry.

DETAILED DESCRIPTION

Technology is disclosed for programing NAND memory. An embodiment of a memory system has control circuitry that applies a low voltage (e.g., VSS) to SGS lines in one or more unselected blocks that neighbor a block that has been selected for programming. This low voltage keeps source select transistors off, which cuts off the NAND channels in the neighbor unselected block(s) from the source line. The blocks are not required to be separated by metallic shielding. Therefore, there could be capacitive coupling between the control lines in the selected block and control lines in the neighbor unselected block(s). If the SGS lines in the neighbor unselected block(s) were permitted to float the source select transistors could at least weakly turn on, which could result in a low voltage on the source line being passed to the NAND channels in the unselected block(s). However, keeping the SGS transistors off allows the NAND channels in the neighbor unselected block(s) to float, which helps prevent program disturb. However, the control circuit may float the SGS lines in other unselected blocks, which allows the source line voltage to ramp up quickly to provide for a faster programming operation.

Figure 2A:
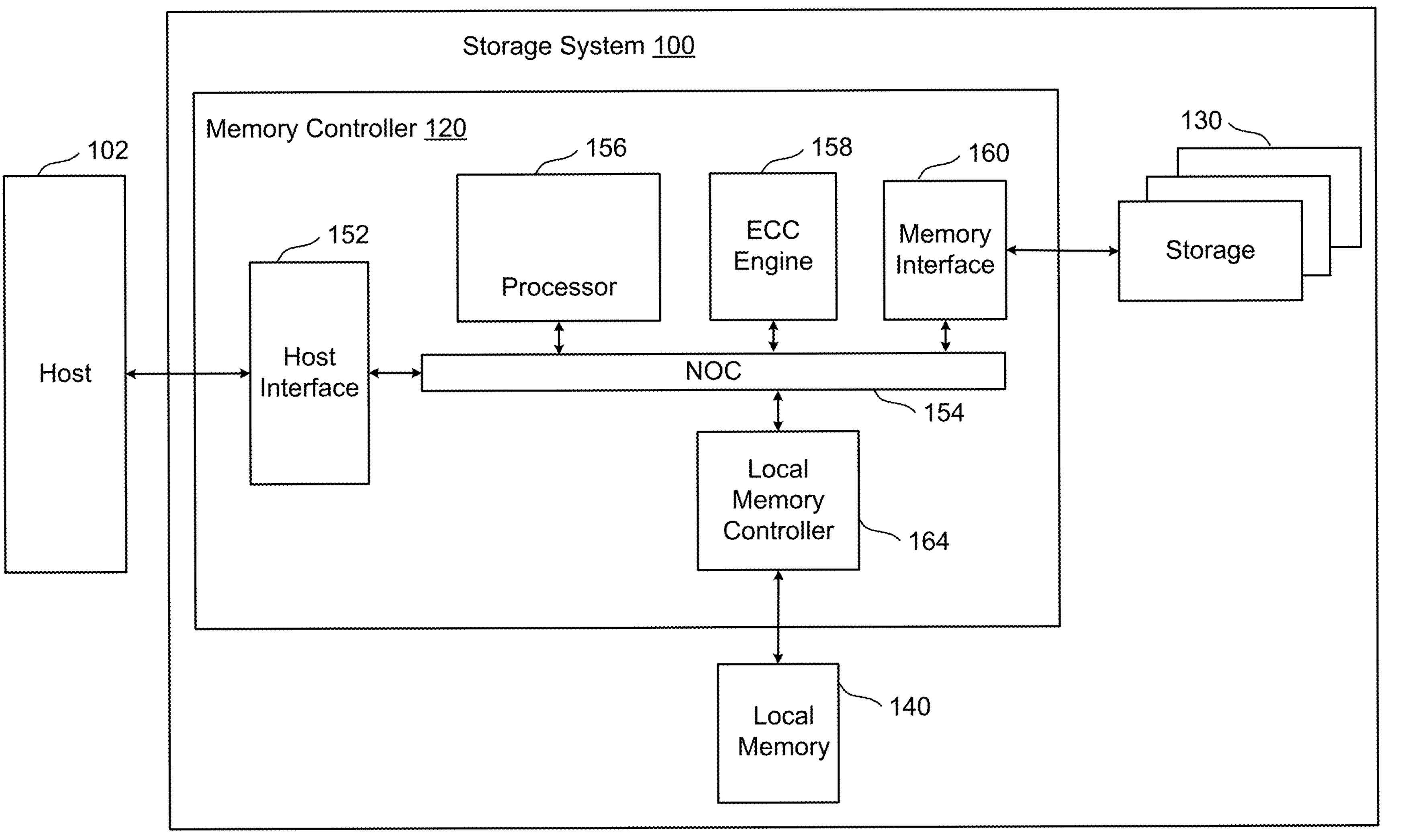
FIG. 2A is a block diagram depicting one embodiment of a memory system.

FIG. 2A is a block diagram of one embodiment of a memory system 100 that implements the technology described herein. In one embodiment, memory system 100 is a solid state drive ("SSD"). Memory system 100 can also be a memory card, USB drive or other type of memory system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 2A are electrical circuits. Memory system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations such as programming, erasing, reading, and memory management processes. In one embodiment, processor 156 is programmed by firmware. In other embodiments, processor 156 is a custom and dedicated hardware circuit without any software. Processor 156 may also implement a translation module, as a software/firmware process or as a dedicated hardware circuit. In many systems, the non-volatile memory is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a memory system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2B:
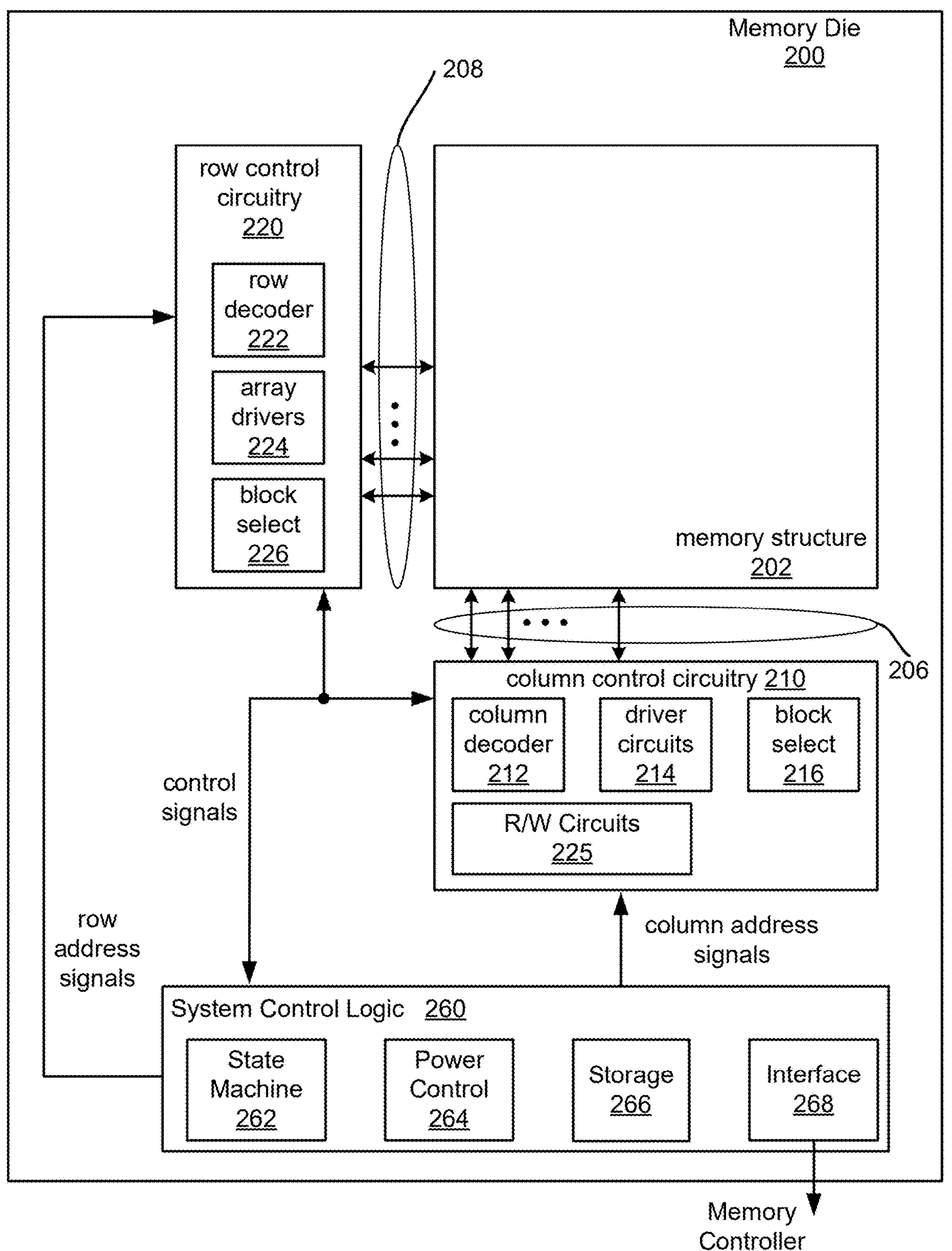
FIG. 2B is a block diagram of one embodiment of a memory die.

In one embodiment, non-volatile storage 130 comprises one or more memory dies. FIG. 2B is a functional block diagram of one embodiment of a memory die 200 that comprises non-volatile storage 130. Each of the one or more memory dies of non-volatile storage 130 can be implemented as memory die 200 of FIG. 2B. The components depicted in FIG. 2B are electrical circuits. Memory die 200 includes a memory structure 202 (e.g., memory array) that can comprise non-volatile memory cells (also referred to as non-volatile storage cells), as described in more detail below.

The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuity 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2B can be grouped into two parts: (1) memory structure 202 and (2) peripheral circuitry, which includes all of the other components depicted in FIG. 2B. An important characteristic of a memory circuit is its capacity, which can be increased by increasing the area of the memory die of memory system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the memory system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2B onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2C:
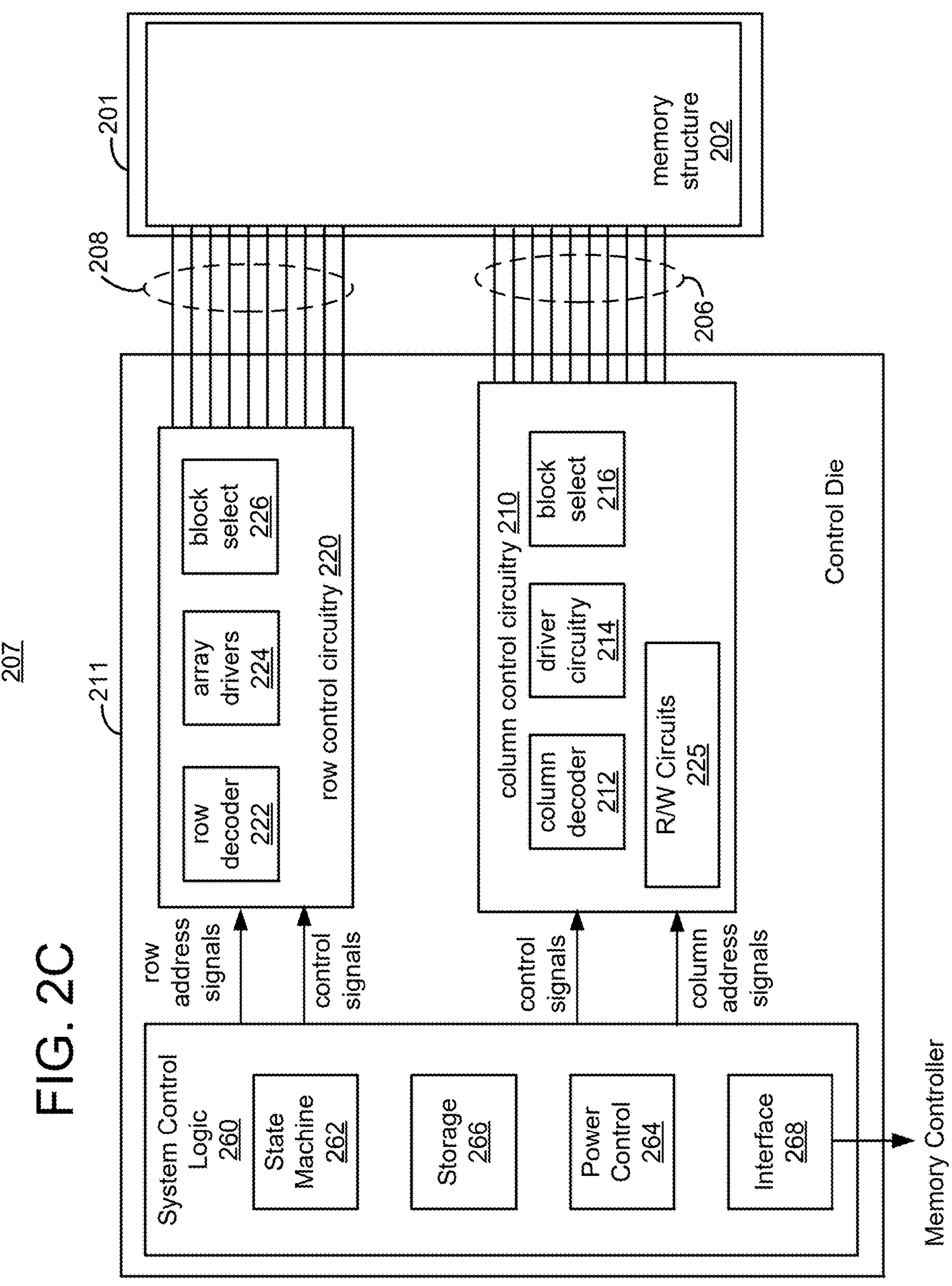
FIG. 2C is a block diagram of one embodiment of an integrated memory assembly.

FIG. 2C shows an alternative arrangement to that of FIG. 2B which may be implemented using wafer-to-wafer bonding to provide a bonded die pair. FIG. 2C depicts a functional block diagram of one embodiment of an integrated memory assembly 207. One or more integrated memory assemblies 207 may be used to implement the non-volatile storage 130 of memory system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2C shows an example of the peripheral circuitry, including control circuits, formed in a peripheral circuit or control die 211 coupled to memory structure 202 formed in memory structure die 201. Common components are labelled similarly to FIG. 2B. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2C shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. For purposes of this document, the term "apparatus" can include, but is not limited to, one or more of, memory system 100, storage 130, memory die 200, integrated memory assembly 207, and/or control die 211.

Figure 3A:
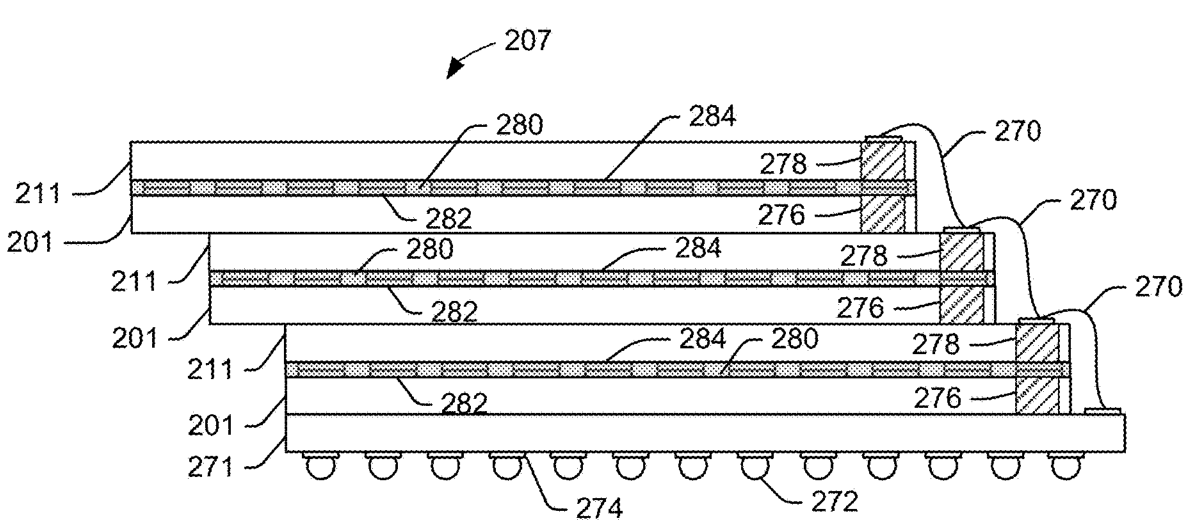
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
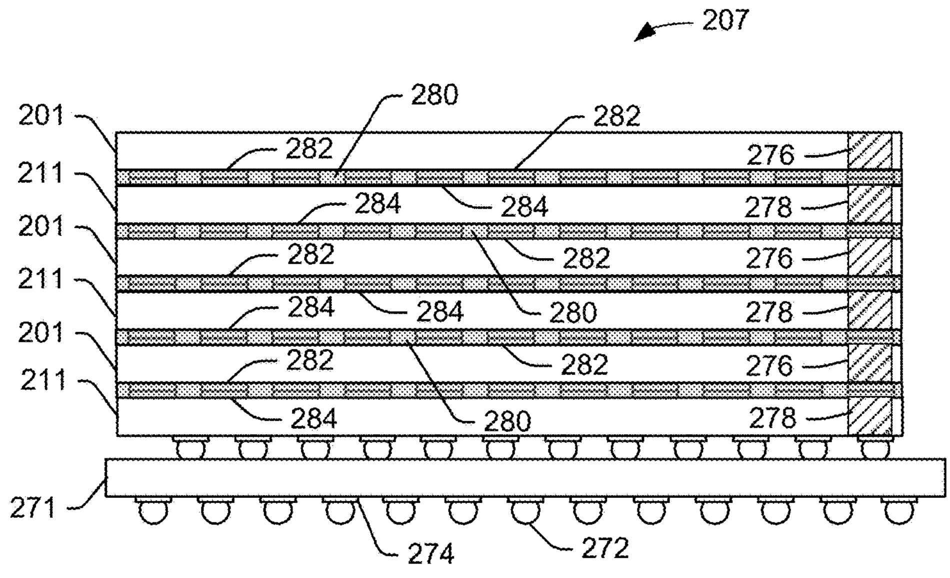

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together.

Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
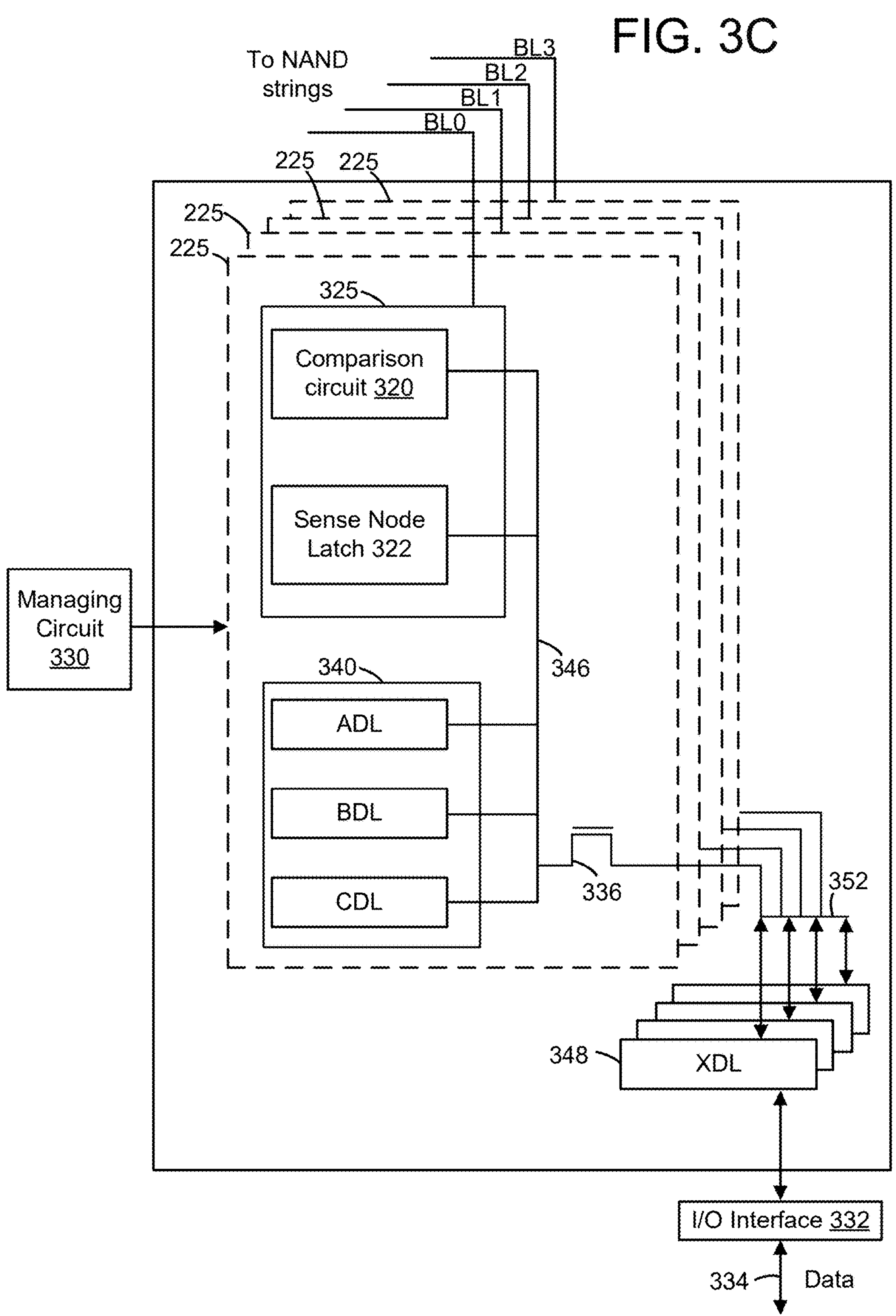
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. The following will discuss use of the sense amplifier 325 to sense a condition (e.g., data state) of a memory cell.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
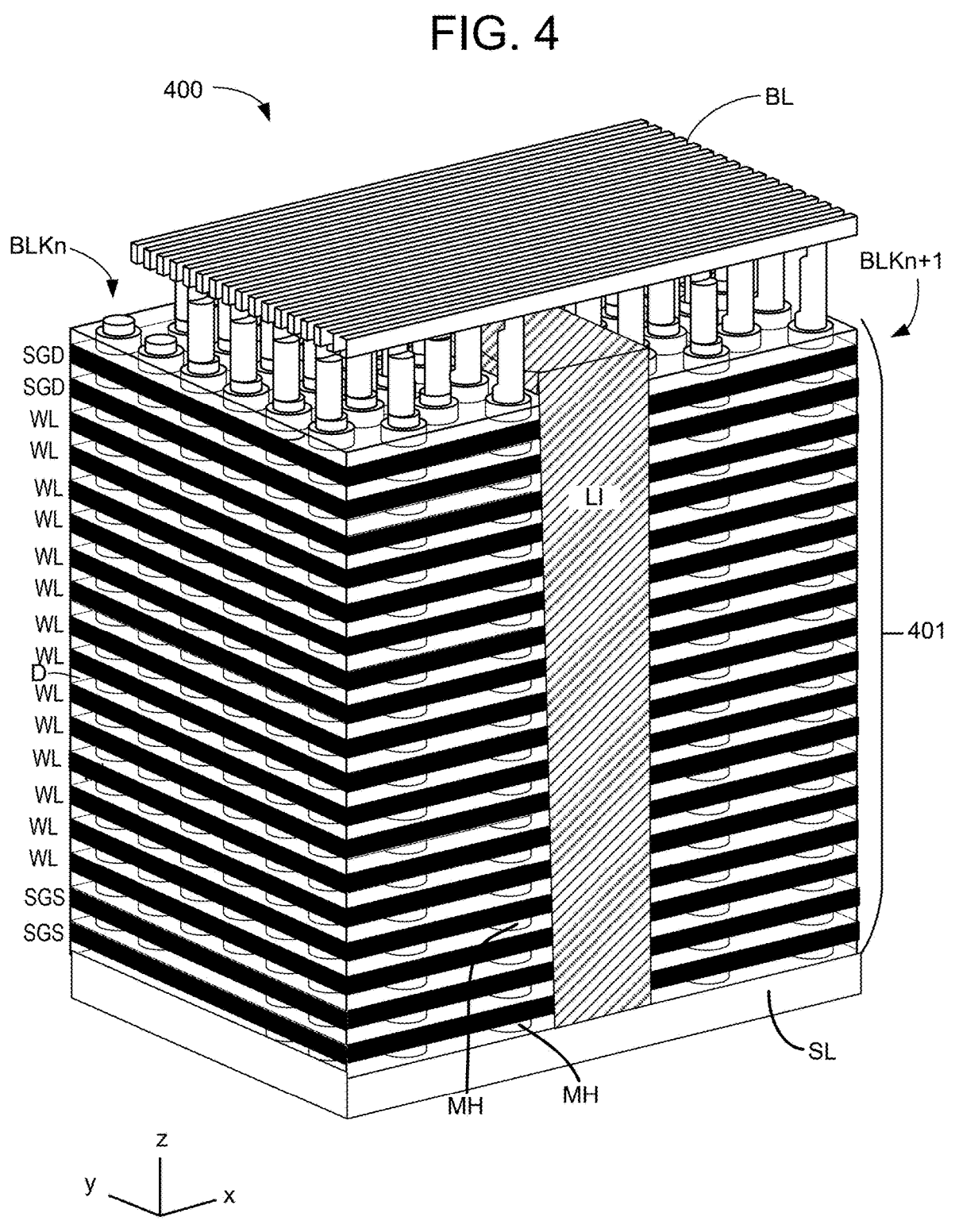

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of two neighboring blocks (BLKn, BLKn+1) of memory. The structure depicted includes a set of bit lines BL positioned above a stack 401 of alternating dielectric layers and conductive layers. For example purposes, one of the dielectric layers is marked as D. The conductive layers in BLKn are labeled as one of: SGD, WL, or SGS. BLKn+1 has similar layers. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. A local interconnected (LI) region separates the two blocks (BLKn, BLKn+1). The LI region is formed from an insulator such as, for example, silicon oxide. In an embodiment, the LI region does not contain a metallic structure. Because the LI region does not contain a metallic structure there may be significant capacitive coupling between a metal layer in BLKn and an adjacent metal layer in BLKn+1. As one example, if a program voltage is applied to one of the word lines in BLKn while the adjacent word line in BLKn+1 is floating, the adjacent word line in BLKn+1 could increase towards the program voltage due to capacitive coupling. Such increases in the voltage on the word lines in the BLKn+1 could potentially result in program disturb in BLKn+1 when BLKn is selected for programming. However, an embodiment of a memory system applies a voltage to the SGS layer in BLKn+1 to ensure that SGS gates in BLKn+1 are off and the NAND channels in BLKn+1 float in order to prevent program disturb in BLKn+1 when programming in BLKn. Moreover, the memory system may float the SGS layer in other unselected blocks to allow for a fast ramping up of the voltage on the source line (SL). Further details are discussed below.

Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
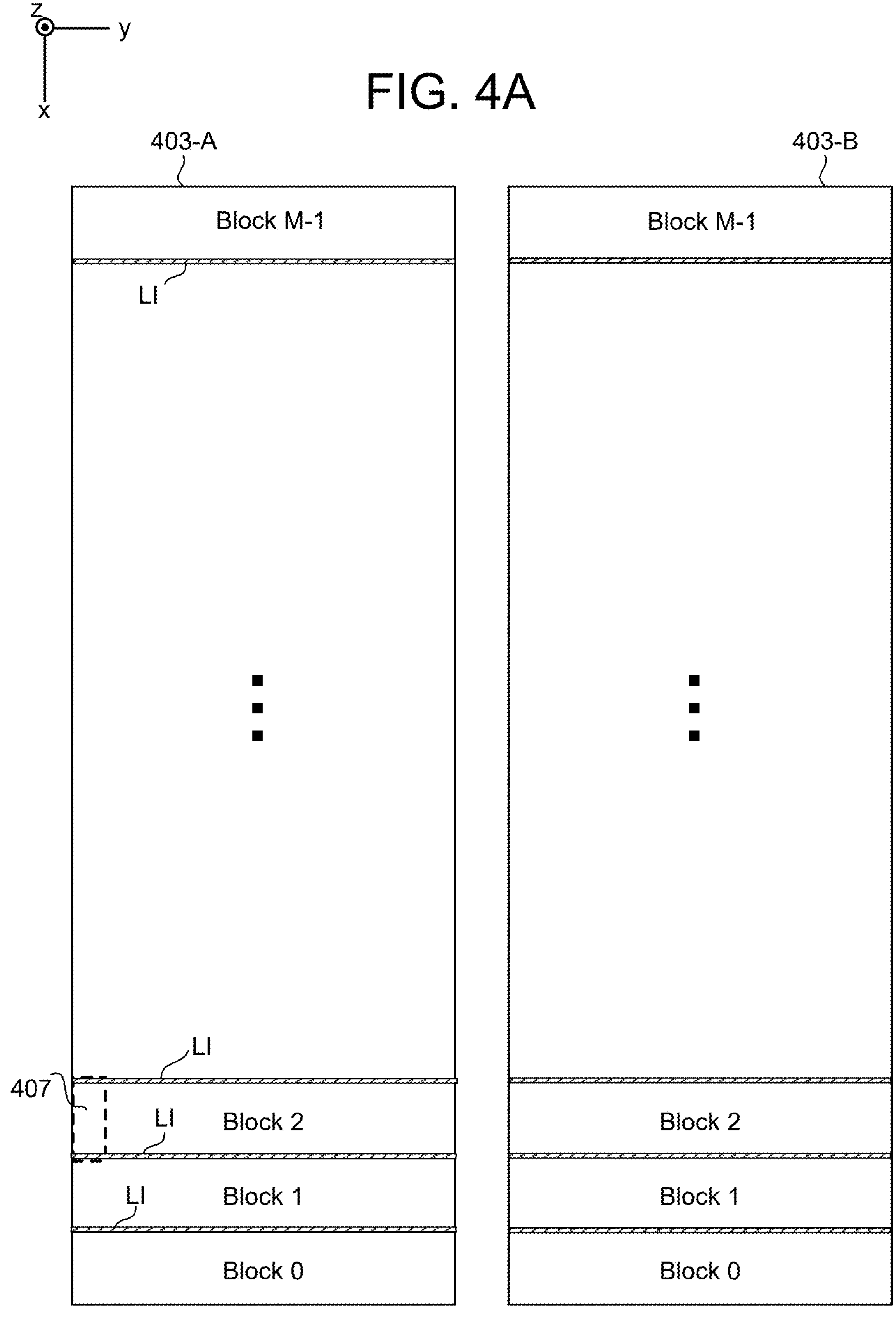
FIG. 4A is a block diagram of one embodiment of a memory structure having two planes.

FIG. 4A is a block diagram explaining one example organization of memory structure 202, which is divided into two planes 403-A and 403-B. Each plane 403 is then divided into M physical blocks. In one example, each plane has about 2000 physical blocks (or more briefly "blocks"). However, different numbers of blocks and planes can also be used. There is an LI region that separates each pair of neighboring blocks. This LI region provides electrical isolation between the conductive layers (e.g., word lines, select lines) in the two neighboring blocks. The LI region contains an insulator such as, for example, silicon oxide. In an embodiment, the LI region does not contain a metallic region, and therefore does not contain a metallic shield between the pair of neighboring blocks.

In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. In an embodiment, each plane 403-A, 403-B has a set of bit lines that extend across all of the blocks in that plane. In an embodiment, one block per plane is selected at a time. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403-A, 403-B more or fewer than two planes can be implemented. In some embodiments, memory structure 202 includes four planes. In some embodiments, memory structure 202 includes eight planes. In some embodiments, programming can be performed in parallel in a first selected block in plane 403-A and a second selected block in plane 403-B.

Figure 4B:
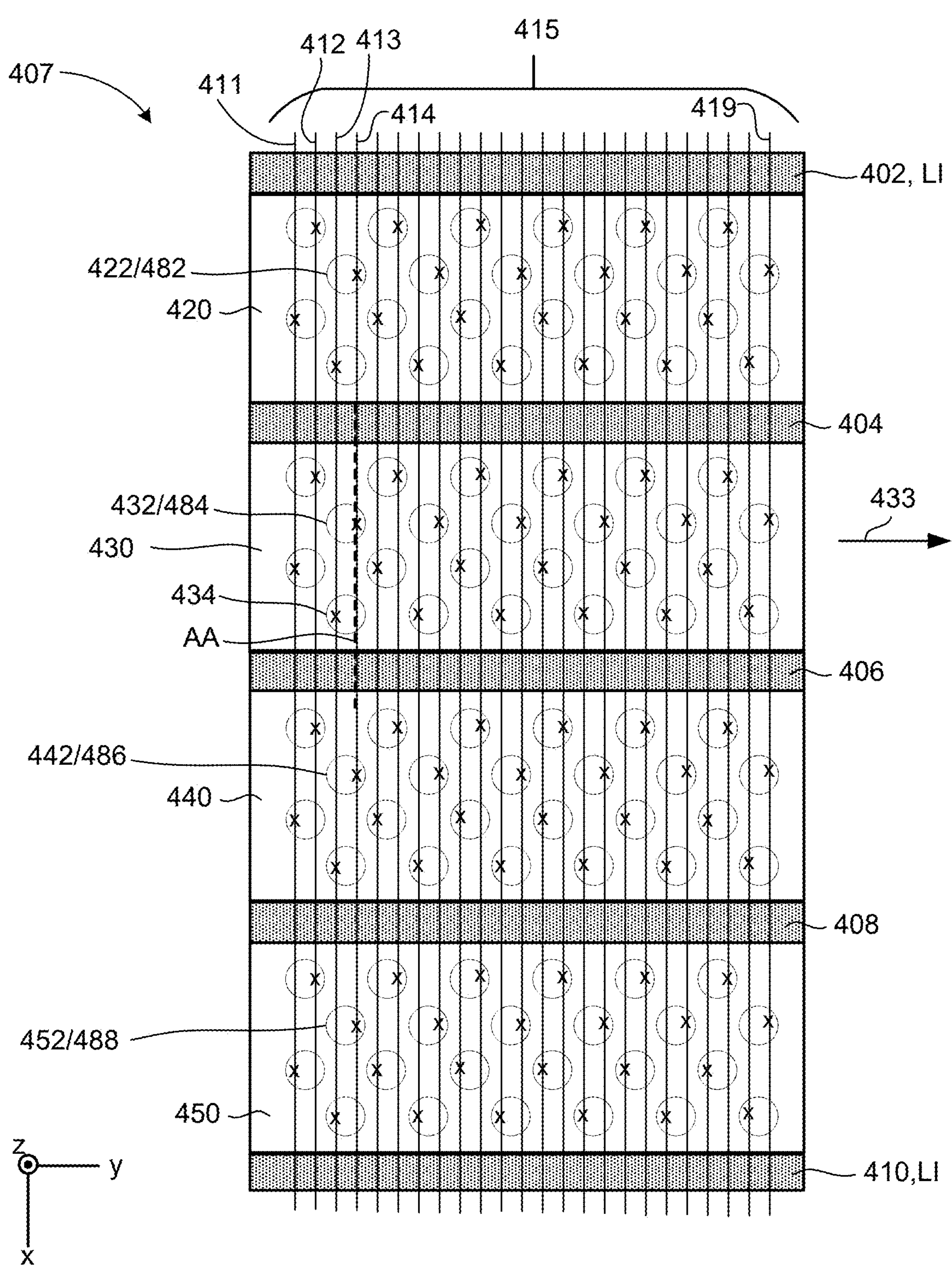
FIG. 4B is a block diagram depicting a top view of a portion of block of memory cells showing an array region.

FIGS. 4B-4E depict an example three dimensional ("3D") NAND structure that corresponds to the structure of FIG. 4 and can be used to implement memory structure 202 of FIGS. 2B and 2C. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402 and 410 are two example of LI regions, which separate the block from its two neighbors. Isolation regions 404, 406, 408 are within the block and do not necessarily extend down to the source line. Isolation regions 402, 404, 406, 408, and 410 serve to divide the top layers of the physical block into four regions; for example, the top layer depicted in FIG. 4B is divided into regions 420, 430, 440, and 450, which are referred to herein as "sub-blocks." Each sub-block contains a large number of NAND strings. Isolation regions 402 and 410 extend down to the source line. In one embodiment, the isolation regions 404, 406, and 408 only divide the layers used to implement select gates so that NAND strings in different sub-blocks can be independently selected. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
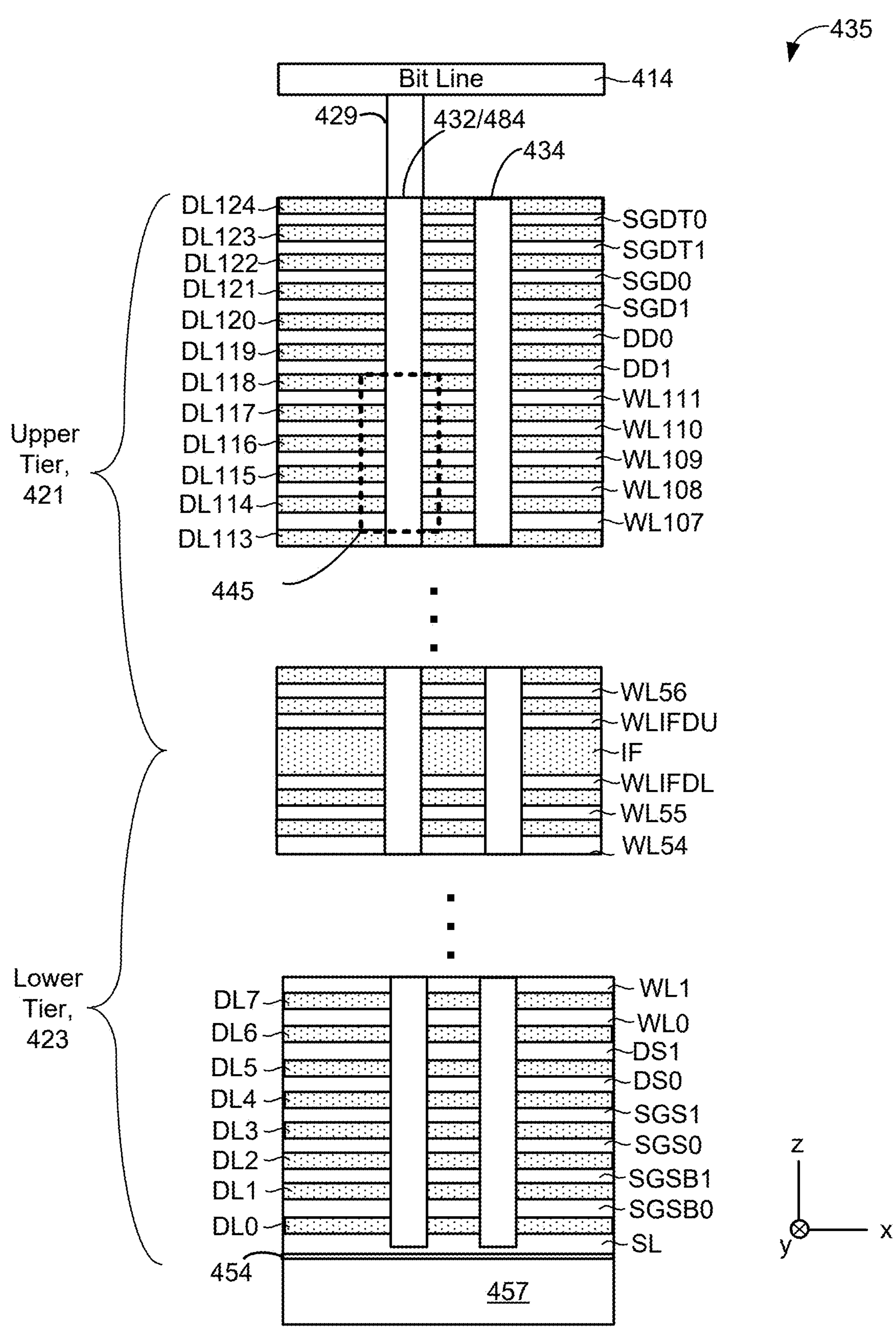
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than six dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 429 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers (lower tier 423, upper tier 421). A two tier or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the tiers are erased independent of one another. Hence, data may be maintained in the upper tier 421 after the lower tier 423 is erased. Likewise, data may be maintained in the lower tier 423 after upper tier 421 is erased.

Figure 4D:
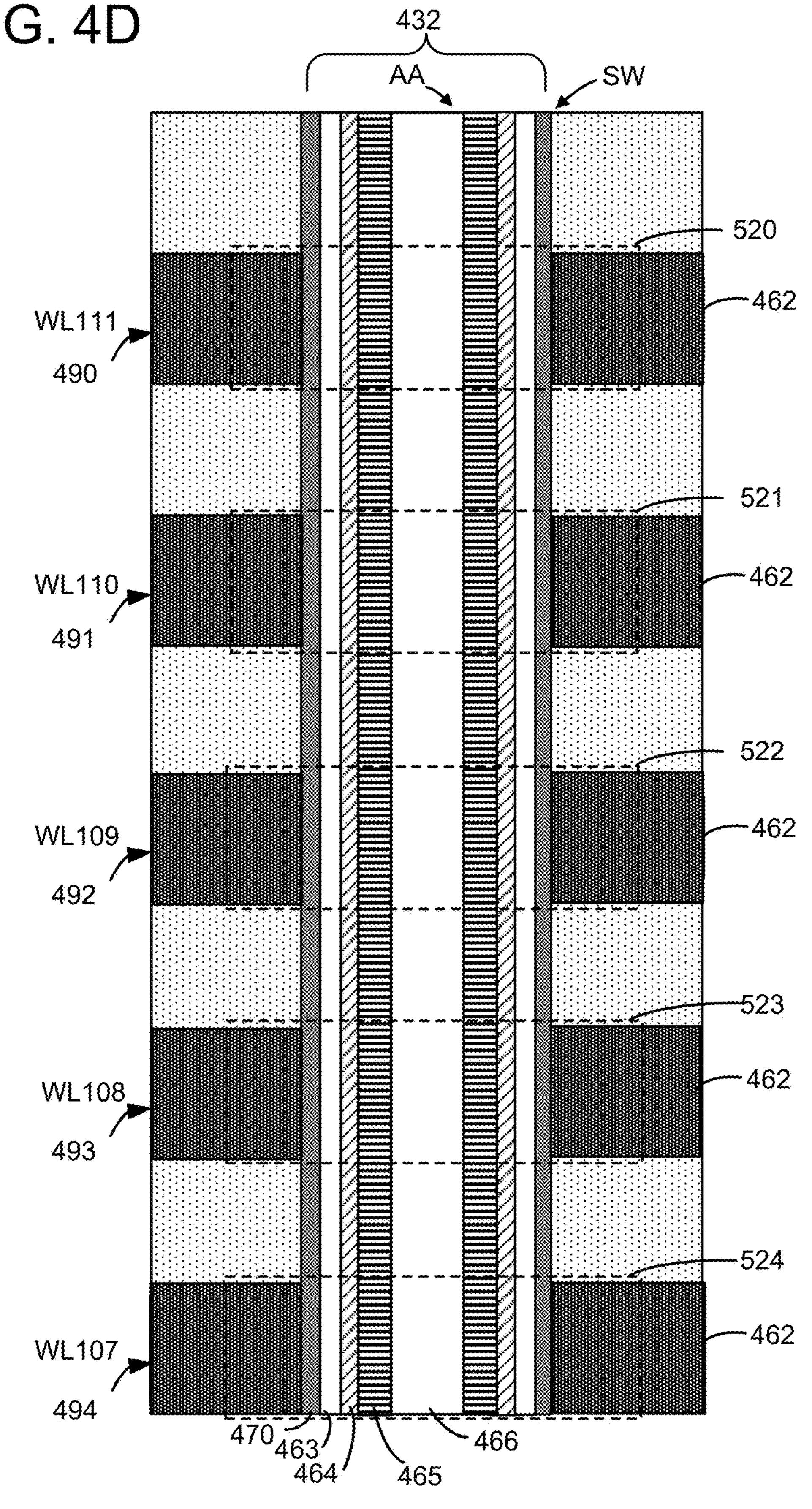
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
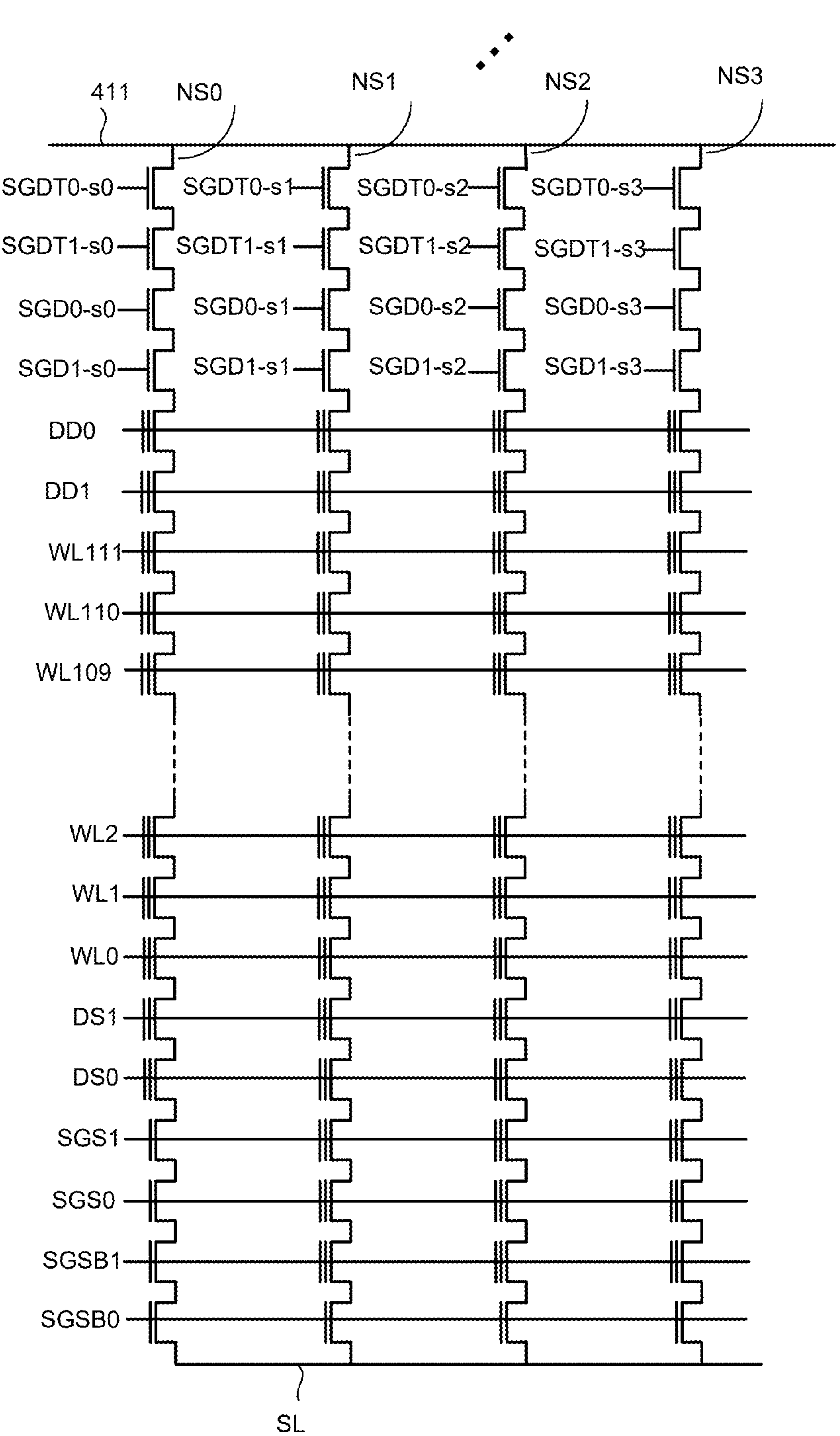
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "sub-blocks." A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3, SGDT1-*s*3, SGD0-*s*3, and SGD1-*s*3. As noted, FIG. 4E only shows the NAND strings connected to bit line 411. However, a full schematic of the block would show every bit line and four vertical NAND strings connected to each bit line.

Although the example memories of FIGS. 4-4E are three dimensional memory structure that includes vertical NAND strings with charge-trapping material, other 3D memory structures can also be used with the technology described herein.

Figure 5:
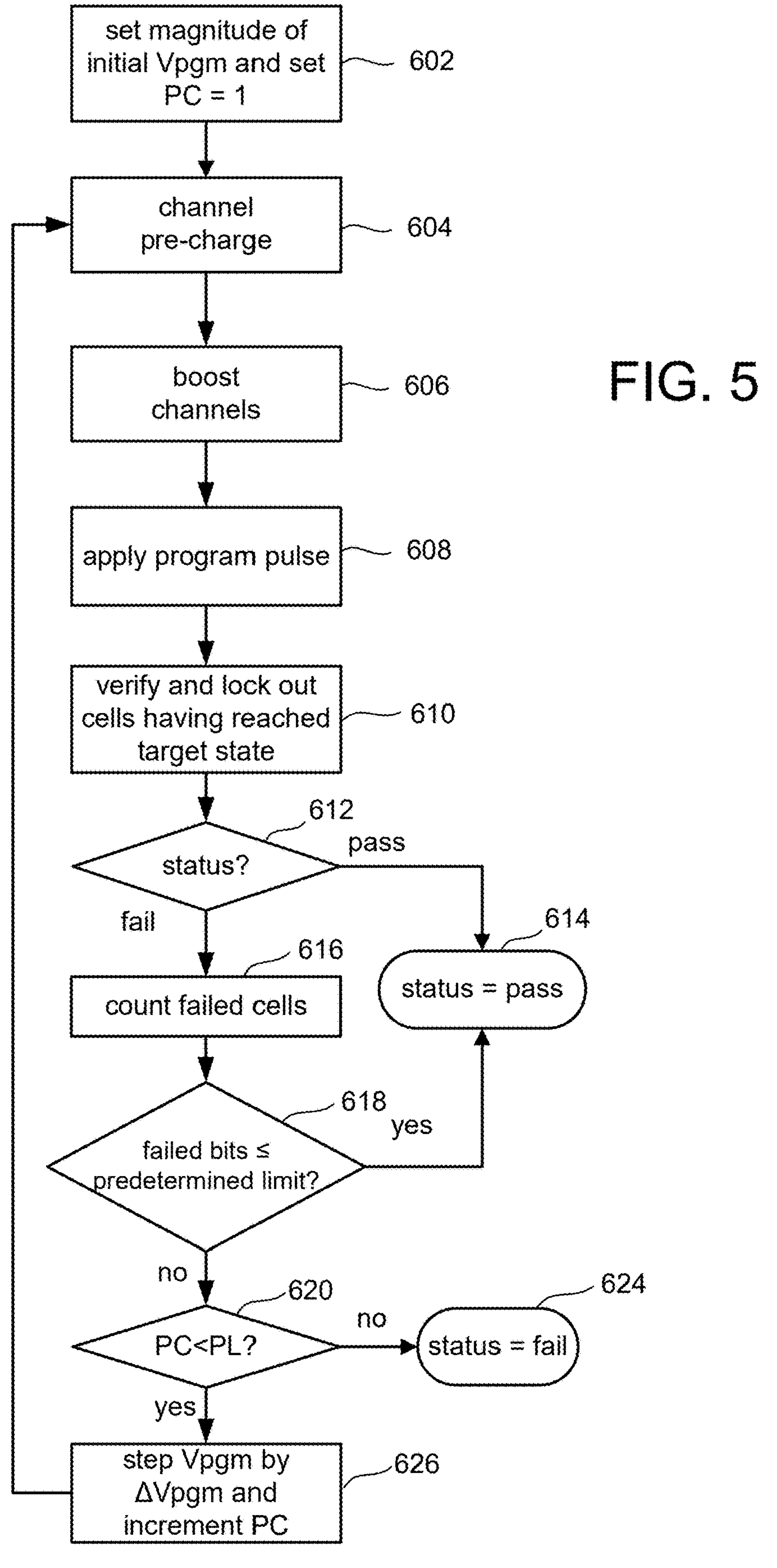
FIG. 5 is a flowchart describing one embodiment of a process for programming memory cells.

The storage systems discussed above can be erased, programmed and read. FIG. 5 is a flowchart describing one embodiment of a process for programming memory cells. For purposes of this document, the term program and programming are synonymous with write and writing. In one example embodiment, the process of FIG. 5 is performed for memory structure 202 using the one or more control circuits (e.g., system control logic 260, column control circuitry 210, row control circuitry 220) discussed above. In one example embodiment, the process of FIG. 5 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 5 is performed to implement the full sequence programming, as well as other programming schemes including multi-stage programming. When implementing multi-stage programming, the process of FIG. 5 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 5, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 5 is performed.

Figures 6A, 6B:
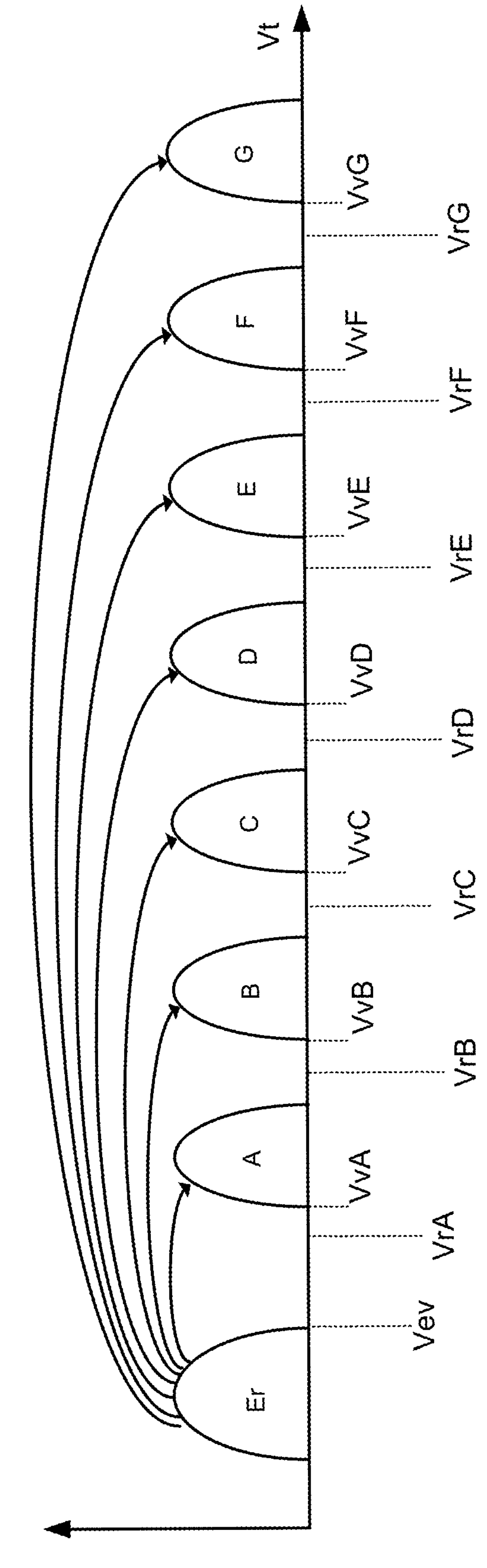
FIGS. 6A, 6B and 6C depict threshold voltage distributions.

At the end of a successful programming process, the threshold voltages of the memory cells should be within one or more distributions of threshold voltages for programmed memory cells or within a distribution of threshold voltages for erased memory cells, as appropriate. FIG. 6A a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 6A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 6A depicts read reference voltage Vr. By testing (e.g., performing one or more sense operations) whether the threshold voltage of a given memory cell is above or below Vr, the system can determine whether a memory cell is erased (state E) or programmed (state P). FIG. 6A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 6B, each memory cell stores three bits of data. Other embodiments may use other data capacities per memory cell (e.g., such as two, four, or five bits of data per memory cell).

FIG. 6B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 6B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 6B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6C:
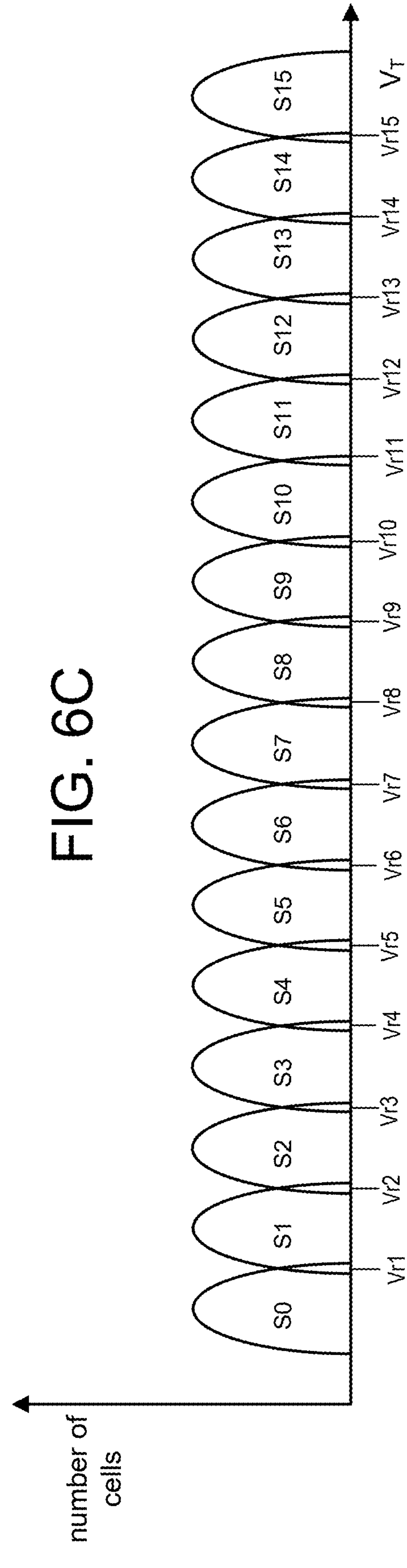

FIG. 6C illustrates example threshold voltage distributions for the memory array when each memory cell stores four bits of data. Other embodiments, however, may use other data capacities per memory cell (e.g., such as one, two, three, or five bits of data per memory cell). FIG. 6C shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. Each read reference voltages Vr1-Vr15 used to distinguish between two adjacent threshold voltage distributions may be referred to herein as a "hard bit" reference voltage. By testing (e.g., performing sense operations) whether the threshold voltage of a given memory cell is above or below the 15 read reference voltages, the system can determine what data state (i.e., S0, S1, S2, S3 . . . ) a memory cell is in.

FIG. 6C depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11 to read one of the pages.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6C depicts that there may be some overlap between the data states S0-S15. The overlap may occur due to factors such as memory cells changing charge over time, which is referred to herein as a data retention issue (or more briefly "data retention"). Some states tend to lose charge over time, and therefore may exhibit a drop in Vt over time. However, other states could gain charge over time, and therefor exhibit an increase in Vt over time. For some NAND memory cells there is a neutral Vt, which is a Vt that the memory cell will tend to move towards over time. Memory cells programmed to a Vt above the neutral Vt may tend to see a drop in Vt over time. Memory cells programmed to a Vt below the neutral Vt may tend to see an increase in Vt over time.

Figure 7:
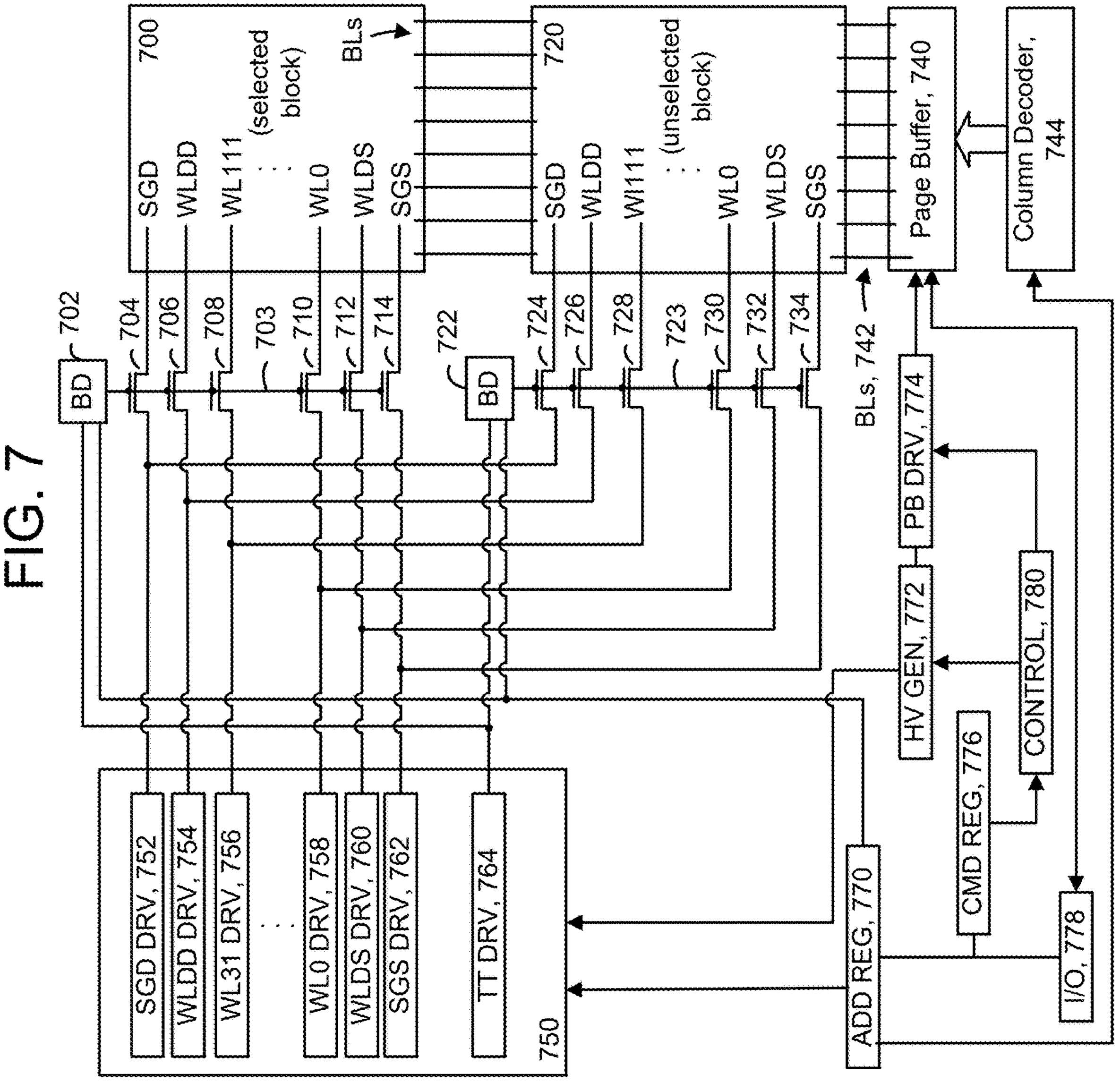
FIG. 7 depicts a memory device having circuitry for providing operating voltage to blocks of memory cells.

FIG. 7 depicts a memory device having circuitry for providing operating voltage to blocks of memory cells. Each block of storage elements is associated with a set of transfer transistors, in one possible embodiment. These transfer transistors may include WLSW transistors and also similar transistors for providing operating voltage to SGD and SGS. For example, block 700, which is the selected block in this example, e.g., a block in which a programming or sense operation is to take place, includes a drain-side select gate (SGD) connected to a transfer transistor 704, a drain-side dummy word line (WLDD) connected to a transfer transistor 706, a word line (WL111) connected to a transfer transistor 708, intermediate word lines WL110-WL1 (not shown) connected to respective transfer transistors (not shown), a word line (WL0) connected to a transfer transistor 710, a source-side dummy word line (WLDS) connected to a transfer transistor 712, and a source-side select gate (SGS) connected to a transfer transistor 714. Note that this is a simplified example and there may be more transfer transistors. The control gate of each transfer transistor of the block 700 is connected to a block decoder (BD) 702 via a common path 703. The BD 702 receives a voltage from a transfer transistor driver (TT DRV) 764 and a control signal from an address register (ADD REG) 770. The control signal includes an address. In an embodiment, if the address matches an address of the BD 702, the BD 702 acts as a conductive switch which passes the voltage to the control gates of the associated transfer transistors via path 703. In an embodiment, if the address does not match the address of the BD 702, the BD 702 acts as a non-conductive switch which does not pass the voltage to the control gates of the associated transfer transistors. In some embodiments, the BD 702 contains dummy block selection logic, which is configured to respond to an address of a neighbor block (e.g., dummy block selection logic 1402 in FIGS. 14 and 15). In some embodiments, the BD 702 forwards a block selection signal to BD 722, which uses the forwarded block selection signal to control the SGS switch 714. Further details of forwarding block selection signal are discussed below in connection with FIG. 12.

Each transfer transistor may be an nMOSFET, for example, which has a drain node on the left hand side and a source node on the right hand side (connected to the associated control line in the block 700, 720). The drain node for each transfer transistor is connected to a respective voltage driver in a set of high-voltage voltage drivers 750. Each driver may include an on-chip charge pump. For example, the transfer transistor 704 is connected to a drain select gate driver (SGD DRV) 752, the transfer transistor 706 is connected to a dummy word line driver (WLDD DRV) 754, the transfer transistor 708 is connected to the word line driver (WL31 DRV) 756, . . . , the transfer transistor 710 is connected to the word line driver (WL0 DRV) 758, the transfer transistor 712 is connected to the source side dummy word line driver (WLDS DRV) 760, and the transfer transistor 714 is connected to the source select gate driver (SGS DRV). Each voltage driver can be independently controlled to provide a desired output voltage.

A similar arrangement is used for the example unselected block 720, which includes a transfer transistor 724 connected to SGD and SGD DRV 752, a transfer transistor 726 connected to WLDD and WLDD DRV 754, a transfer transistor 728 connected to WL31 and WL31 DRV 756, . . . , a transfer transistor 730 connected to WL0 and WL0 DRV 758, a transfer transistor 732 connected to WLDS and WLDS DRV 760, and a transfer transistor 734 connected to SGS and SGS DRV 762. The control gates of the transfer transistors of the unselected block 720 are connected to a respective block decoder (BD) 722 via a common path 723. The BD 722 is also connected to the TT DRV 764 to receive a voltage, and to the address register 770 to receive a control signal which instructs the BD 722 to pass or not pass the voltage to the control gates of the associated transfer transistors via path 723. The address register (ADD REG) 770 also communicates with the voltage drivers in the set of high-voltage voltage drivers 750.

A number of bit lines (BLs) 742 extend across the selected block 700 and the unselected block 720 (and across additional unselected blocks, not shown, in some implementations) and into a page buffer 740, which is responsive to a column decoder 744. The page buffers stores data which is written into, or read from, a selected word line of the selected block. During an operation of the memory device, the address register 770 provides a data load command to an input-output buffer 778 and to a command register 776. The input-output buffer 778 provides the command to the page buffer 740. The command register 776 provides a command to a control circuit 780, which instructs a high voltage generator 772 to control the voltage drivers 750 at appropriate levels. Typically, during programming, the driver of the selected word line provides a programming level voltage, such as 12-26 V while the unselected word lines receive a boosting voltage $V_{PASS}$. During sensing, the driver of the selected word line provides a read or verify level voltage ($V_{CGR}$ or $V_{VERIFY}$, respectively), while the unselected word lines receive a read pass voltage, $V_{READ\text{-}PASS}$. The control 780 also instructs the page buffer driver (PB DRV) 774 to control the page buffer 740. The address register 770 also communicates with the column decoder 744.

Figure 8:
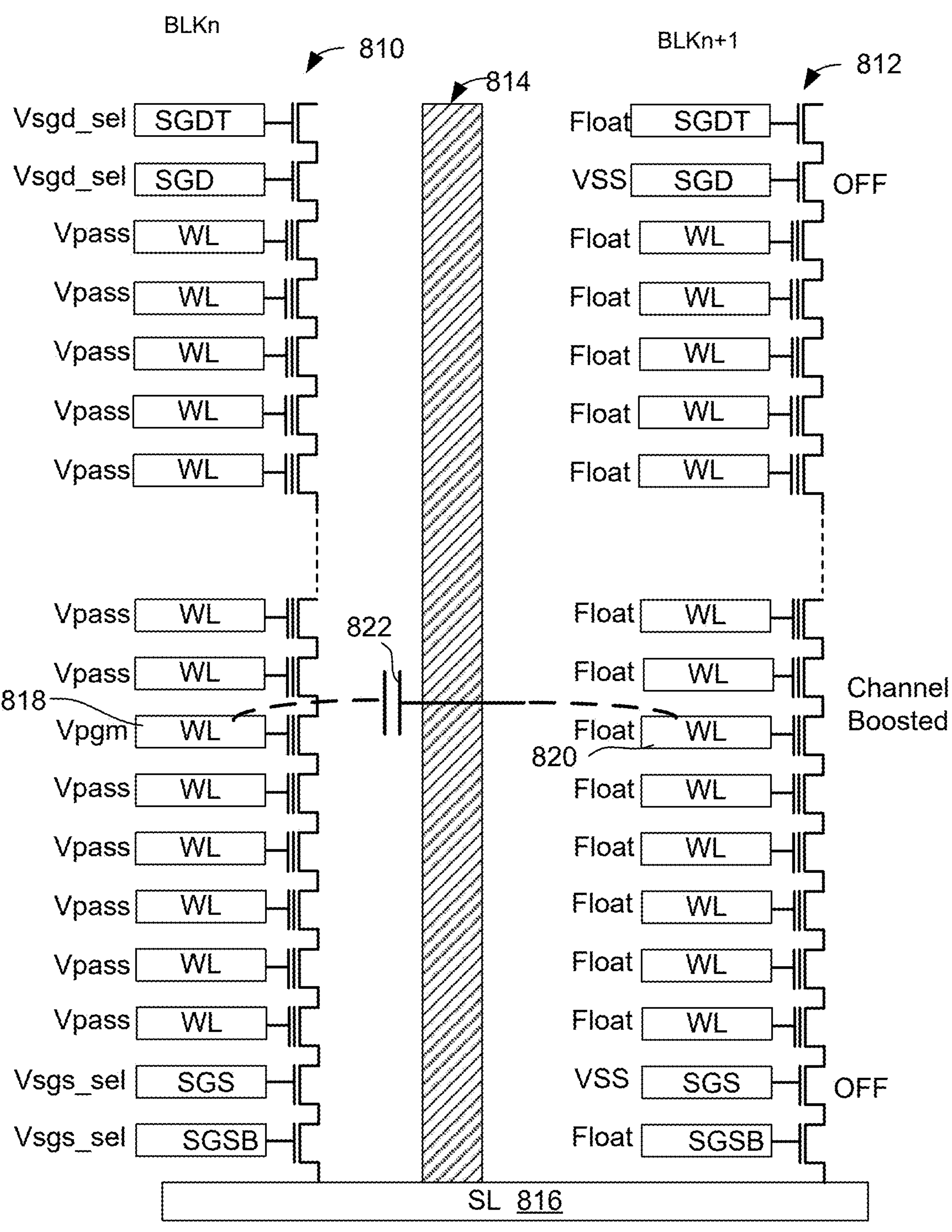
FIG. 8 is a schematic diagram of a portion of an embodiment of voltages applied during programming in NAND memory structure.

FIG. 8 is a schematic diagram of a portion of an embodiment of voltages applied during programming in NAND memory structure. A portion of two adjacent blocks (BLKn, BLKn+1) are depicted. Each block has many NAND strings, however, only one NAND string is depicted in each block. NAND string 810 is depicted in BLKn, which has been selected for a program operation. NAND string 812 is depicted in BLKn+1, which is not selected (i.e., unselected) for the program operation. The two NAND strings are both connected to the same source line (SL) 816. In an embodiment, all of the blocks in a plane share the same source line.

Each block has control lines that connects to the control gates of the transistors on the NAND strings in that block. Memory cell transistors are connected to word lines (WL). Each end of the NAND strings are connected to select lines. Two drain select lines (SGDT, SGD) are depicted in each block. A drain select line is used to connect/disconnect a NAND channel to/from a bit line (bit lines not depicted in FIG. 8). Two source select lines (SGST, SGS) are depicted in each block. A source select line is used to connect/disconnect a NAND channel to/from the source line 16.

FIG. 8 shows voltages applied to the control lines during an embodiment of programming memory cells in BLKn. A program voltage Vpgm is applied to a selected word line in BLKn. The remaining word lines in BLKn receive a boosting voltage (Vpass). The NAND string 810 in the selected block BLKn could be presently undergoing programming or could be inhibited from programming. In the selected block (BLKn), SGDT, SGD, SGST, SGS are provided with voltages that can either facilitate controlling the NAND channel potential to either allow or inhibit programming, depending on the voltage on the bit line. The word lines in the unselected block BLKn+1 are floating during the programming in BLKn.

Figure 1:
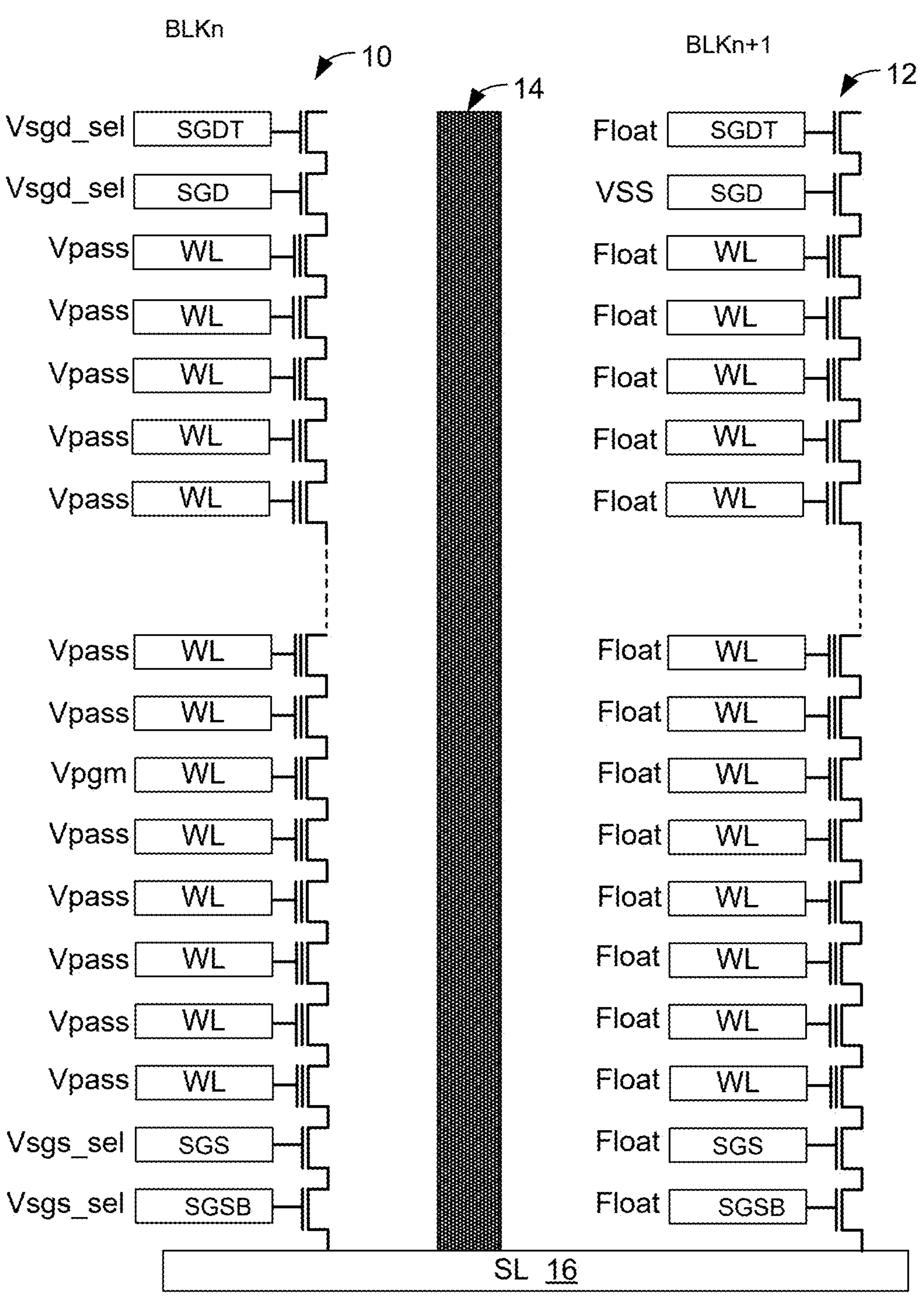
FIG. 1 is a schematic diagram of a portion of a conventional NAND memory structure.

The two blocks are separated by insulating material. The insulating material may include what is referred to herein as a local interconnect (LI) region 814. Note that unlike a conventional structure, such as the conventional stricture in FIG. 1, there is not a metallic shield between the two blocks BLKn, BLKn+1. The lack of a metallic shield between the two blocks BLKn, BLKn+1 may allow significant capacitive coupling between the word lines in the adjacent blocks. Thus, there could be significant capacitive coupling between the selected word line 818 in BLKn and the adjacent word line 820 in BLKn+1, as represented by parasitic capacitance 822. Therefore, voltage on the adjacent word line 820 may be coupled up to a significant percentage of the program voltage on the selected word line 818. It is also possible for the other floating word lines in BLKn+1 to be impacted by adjacent word lines in BLKn, which have Vpass applied thereto. Furthermore, if the channel voltage of the NAND string 812 in BLKn+1 is too low, then program disturb could happen to memory cells connected to the adjacent word line 820 in BLKn+1. If the SGS line in BLKn+1 were floating, there could be significant capacitive coupling between the SGS line in BLKn and the SGS line in BLKn+1, which could result in the source select transistors connected to the SGS line in BLKn+1 to be at least weakly on. If the source select transistors connected to the SGS line in BLKn+1 are on, the NAND channels in BLKn+1 would have their voltages held down by the voltage on the source line SL 816, which could result in program disturb of the memory cells in BLKn+1.

However, the voltage on SGS in the unselected block BLKn+1 is a relatively low voltage (e.g., VSS or 0V) to keep the SGS transistors connected to the SGS line off. Keeping these SGS transistors in BLKn+1 off cuts off the NAND channels in BLKn+1 from the source line SL 816. Moreover, the SGD line in the unselected block BLKn+1 is a relatively low voltage (e.g., VSS or 0V) to keep the SGD transistors connected to the bit lines off. Therefore, the NAND channels in BLKn+1 are allowed to float. Significantly, the voltage on the source line is not permitted to pass to the NAND channels in BLKn+1. Thus, keeping the SGS transistors connected to SGS line in BLKn+1 off prevents the source line voltage from holding down the voltage in the NAND channels in BLKn+1. Moreover, the NAND channels in BLKn+1 may be boosted due to capacitive coupling between the NAND channel and the word lines in the unselected block BLKn+1. Therefore, program disturb to memory cells in BLKn+1 is prevented.

Figure 9A:
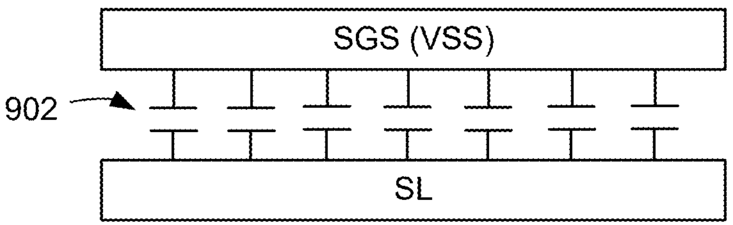
FIG. 9A depicts an SGS line adjacent to a portion of the source line (SL).
Figure 9B:
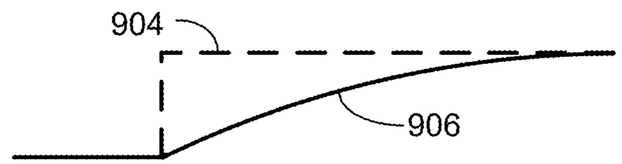
FIG. 9B shows an example of ramping up the voltage on the source line in FIG. 9A.

Therefore, applying a low voltage such as VSS to the SGS line in an unselected block has a technical benefit of preventing program disturb in unselected blocks that neighbor the selected block. However, applying VSS the SGS lines in all of the unselected blocks could slow the rate of ramping up a voltage on the source line. Note that the source line may be shared by all of the blocks in a plane. FIG. 9A depicts an SGS line adjacent to a portion of the source line (SL). In this example, VSS is applied to the SGS line. Significant parasitic capacitance 902 is depicted between the SGS line and the source line (SL). FIG. 9B shows an example of ramping up the voltage on the source line, assuming that VSS is applied to SGS in all of the unselected blocks. Plot 904 is for an ideal ramp time for the source line voltage. Plot 906 shows an example much slower ramp time for the case in which there is substantial parasitic capacitance 902 between the SGS lines in the plane and the source line.

Figure 9C:
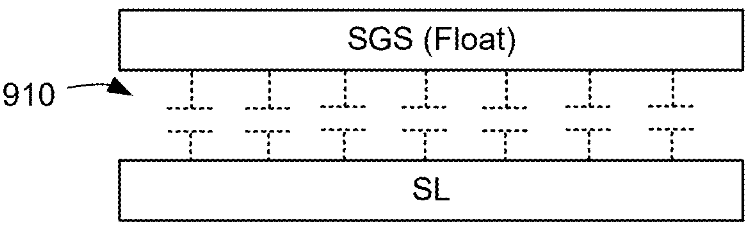
FIG. 9C depicts a floating SGS line adjacent to a portion of the source line (SL).
Figure 9D:
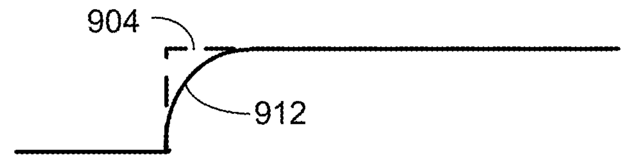
FIG. 9D shows an example of ramping up the voltage on the source line, assuming that most of the SGS lines are floating as in FIG. 9C.

In order to improve the ramp up time on the source line, an embodiment of a memory system will float the SGS lines in most of the unselected blocks in the plane. FIG. 9C depicts a floating SGS line adjacent to a portion of the source line (SL). In this example, because the SGS line is floating there is minimal parasitic capacitance 910 between the floating SGS line and the source line SL. FIG. 9D shows an example of ramping up the voltage on the source line, assuming that most of the SGS lines are floating. Plot 904 is for the ideal ramp time for the source line voltage. Plot 912 shows an example fast ramp time for the case in which there is minimal parasitic capacitance 910 between the SGS lines in the plane and the source line. Significantly, plot 912 has a much faster ramp up than plot 906 in FIG. 9B. Therefore, by floating most of the SGS lines in the plane, the voltage on the source line can be ramped up much faster than if VSS is applied to the SGS lines in all (or most) of the unselected blocks.

Figure 10:
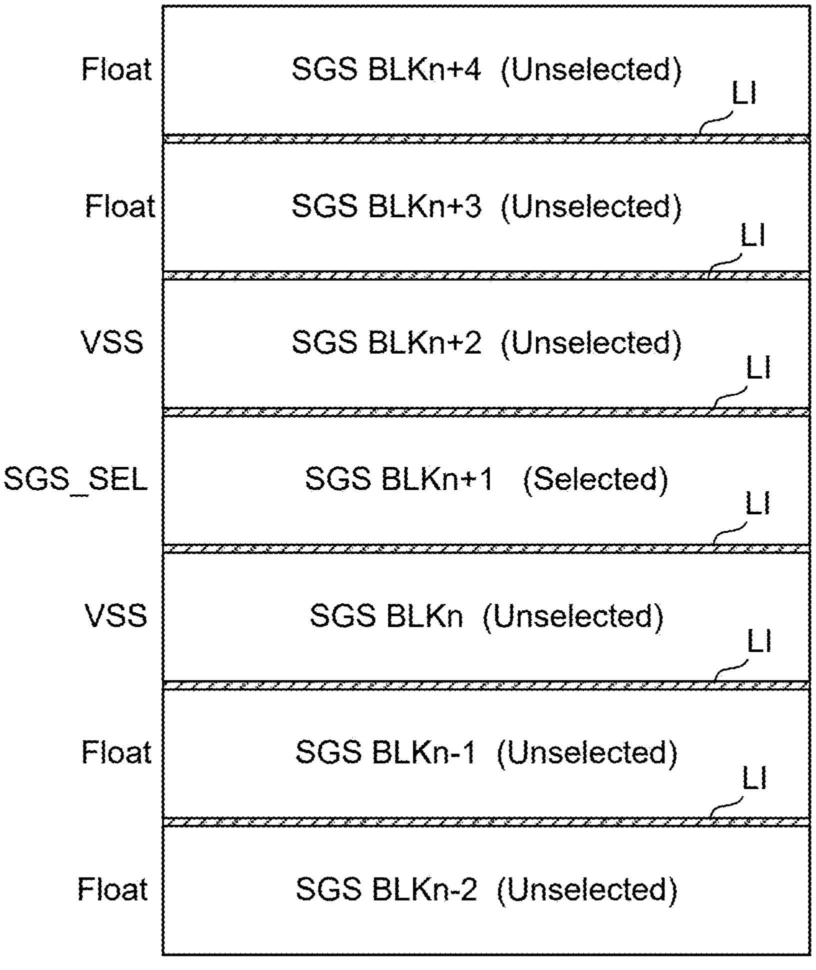
FIG. 10 shows voltages applied to SGS lines in different blocks in an embodiment of a program operation.

FIG. 10 shows voltages applied to SGS lines in different blocks in an embodiment of a program operation. BLKn+1 is selected for a program operation; therefore, SGS_SEL is applied to its SGS line. VSS is applied to the SGS lines in the two neighbor blocks (BLKn+2, BLKn). Applying VSS prevents program disturb in the two neighbor blocks (BLKn+2, BLKn). The SGS lines in the other unselected blocks (BLKn+3, BLKn+4, BLKn−1, BLKn−2) are floated. The remaining blocks in the plane are not depicted, but may also be floated. Floating the majority of the SGS lines in the plane allows a fast ramp up time of the source line. If desired, a few more of the SGS lines near the selected block could have VSS applied without significantly delaying the ramp up time of the source line.

Figure 11:
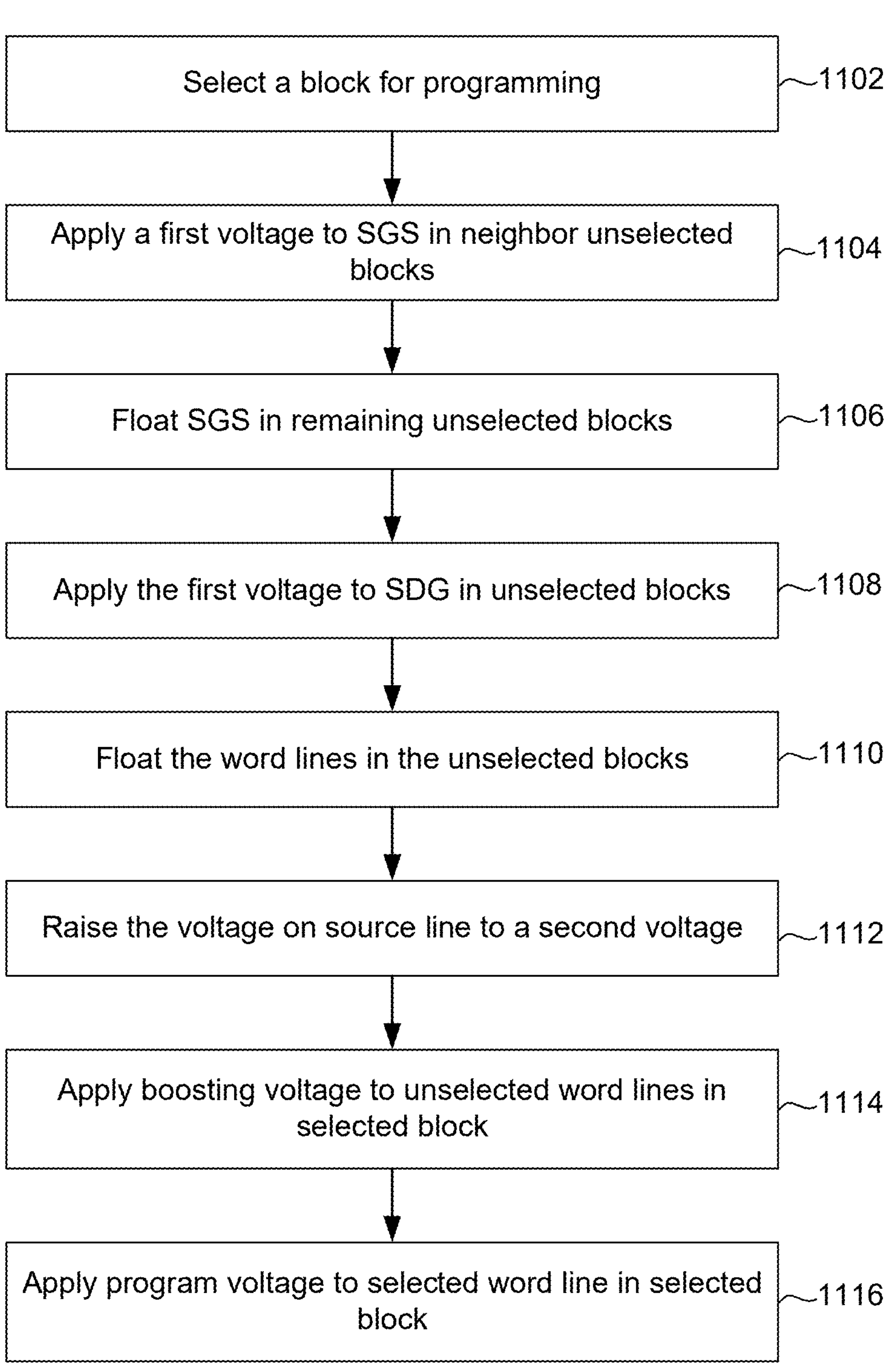
FIG. 11 is a flowchart of one embodiment of a process 1100 of programming NAND memory cells.

FIG. 11 is a flowchart of one embodiment of a process 1100 of programming NAND memory cells. The process 1100 may be used with a 3D NAND memory structure such as those described in FIGS. 4-4E and 8. The process 1100 may be performed by one or more control circuits. In an embodiment, control circuits on the memory die 200 perform process 1100. In an embodiment, control circuits on the control die 211 perform process 1100. The steps are described in a certain order for purpose of discussion. The timing of beginning to apply voltages can be different than the order of the steps. Some steps may occur together. Step 1102 includes selecting a block for programming. The block is one of many blocks in a plane. The blocks in the plane may share a source line.

Step 1104 includes applying a first voltage to the SGS lines in a set of neighbor unselected blocks. Typically this set of neighbor unselected blocks includes a neighbor on each side of the selected block. Optionally, this set could include neighbors that are further away. For example, with reference to FIG. 10, BLKn+1 is selected for programming with BLKn and BLKn+2 being in the set of neighbors to receive the first voltage (e.g., VSS). However, optionally unselected blocks such as BLKn+3, BLKn−1 could be included in the set to receive the first voltage (e.g., VSS).

Step 1106 includes floating the SGS lines in the remaining unselected blocks in the plane. Therefore, most of the unselected blocks in the plane will typically be floated to achieve a fast ramp up time of the voltage on the source line (see step 1112).

Step 1108 includes applying the first voltage (e.g., VSS) to an SGD line in unselected blocks. In an embodiment, all unselected blocks in the plane receive the first voltage (e.g., VSS). This first voltage has a magnitude that will keep off the drain side select gates of the NAND strings in the unselected blocks regardless of the bit line voltage. This first voltage could be 0V, but is not required to be 0V.

Step 1110 includes floating the word lines in the unselected blocks. Note that the process 1100 may be used with an architecture such as depicted in FIG. 8 in which there is not metallic shielding between blocks. Therefore, the floating word lines in the unselected blocks near the selected block could be impacted by the voltages on the word lines in the selected block (see steps 1114, 1116).

Step 1112 includes raising the voltage on the source line to a second voltage. In an embodiment, this source line voltage may be used to help pre-charge the NAND channels in the selected block as part of the process of boosting the voltages of unselected NAND strings in the selected block. However, this source line voltage is relatively low. For example, the source line voltage may be about 2V. Although the source line voltage could be higher or lower than 2V.

Step 1114 includes applying boosting voltages to unselected word lines in the selected block. The boosting voltages have a magnitude well below the program voltage and are used to couple up the voltage in the channels of the unselected NAND strings in the selected block to inhibit programming of memory cells connected to the selected word line. The boosting voltages on the unselected word lines could increase the voltages on the floating word lines in neighbor unselected blocks. The increase in the voltage on the floating word lines in neighbor unselected blocks may in turn couple up the voltage on the channels of the NAND strings in the neighbor unselected blocks to thereby inhibit programming of memory cells in the neighbor unselected blocks.

Step 1116 includes applying a program voltage to the selected word line in the selected block. The program voltage on the selected word lines could increase the voltage on the adjacent floating word line in each of the neighbor unselected blocks. However, the channels of the NAND strings in the neighbor unselected blocks should be sufficiently boosted to prevent program disturb to memory cells in the neighbor unselected blocks.

Figure 12:
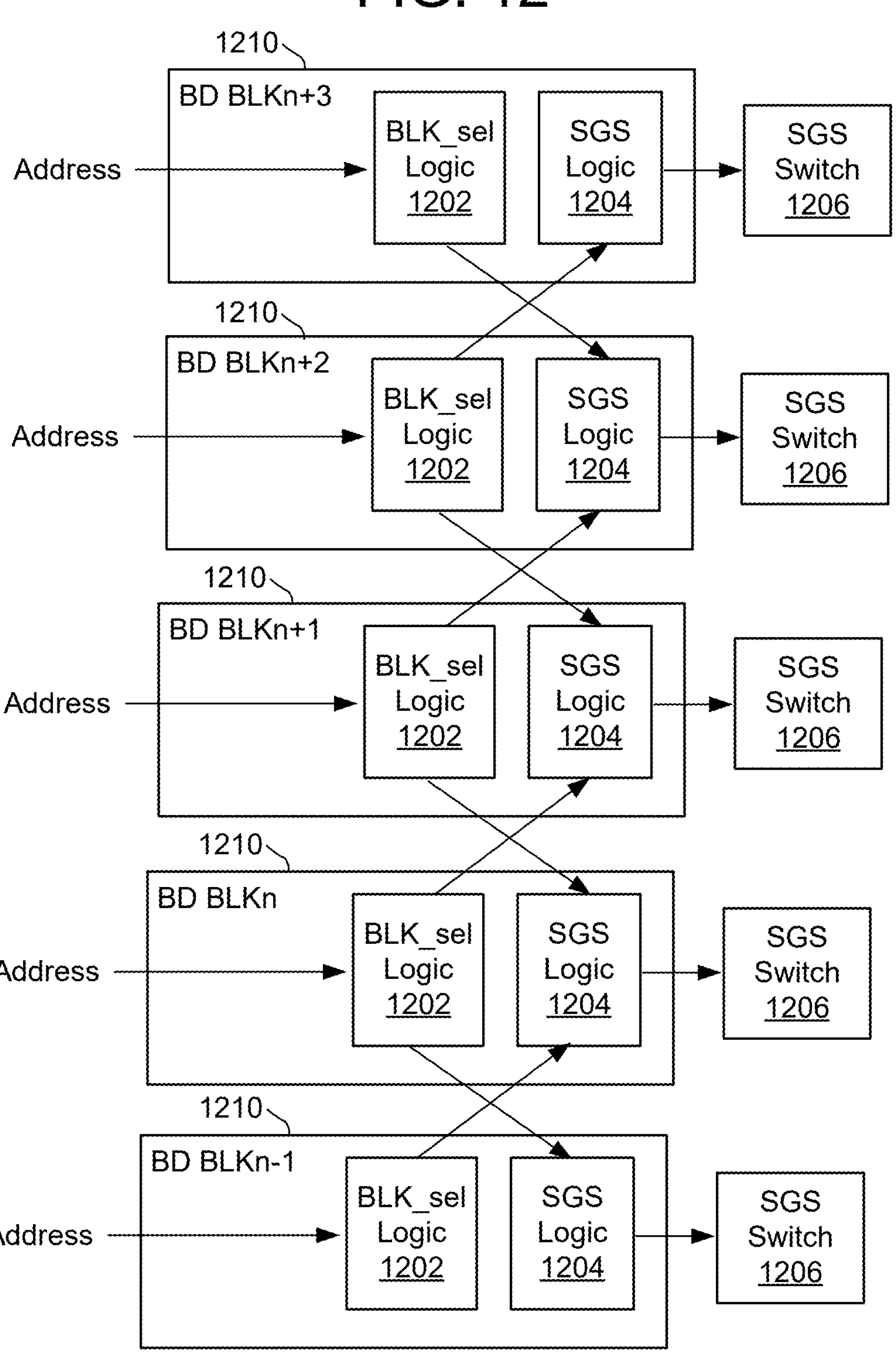
FIG. 12 is a block diagram showing some of the logic to control whether the SGS line is driven to the first voltage or floats.

As noted herein, the SGS line of a small number of unselected blocks may receive a first voltage (e.g., VSS) whereas the SGS line of most of the unselected blocks may float. FIG. 12 is a block diagram showing some of the logic to control whether the SGS line is driven to the first voltage or floats. A number of block decoders (BD) 1210 are depicted. Each block decoder control switches that provide voltages to control lines in one of the blocks. An SGS switch 1206 is depicted for each block decoder. The SGS switch 1206 is used to provide a voltage (or float) an SGS line in the associated block. FIG. 7 shows examples of SGS switches 714, 734, which receive a block select signal from their respective block decoders (BD 702, BD 722). Note that each of these SGS switches 714, 734 has its drain connected to an SGS driver (e.g., SGS DRV, 762), which is able to provide a voltage that may be passed by the SGS switch to the SGS line. For example, the SGS switch 1206 may pass VSS to the SGS line if the SGS switch 1206 is turned on by the block select signal. Alternatively, the SGS line may float if the SGS switch 1206 is turned off by the block select signal. The switches that provide voltages to the word lines and SGD lines are not depicted in FIG. 12. Each block decoder has block select logic 1202, which receives an address signal. The address signal may be provided be the system control logic 260 (see row address signals in FIGS. 2B and 2C). The logic depicted in FIG. 12 may reside within the row control circuitry 220. The BLK_sel logic 1202 decodes the address signal it receives and generates a block select signal having a state that depends on whether the address matches the block address. In an embodiment, when the address matches the block address the BLK_sel logic 1202 generates an active high signal BLKsel having a high voltage and an active low signal BLKseln having a low voltage. That is, when BLKsel is high and BLKseln is low the block has been selected. If the address does not match the block address then the BLK_sel logic 1202 generates a signal BLKsel having a low voltage and a signal BLKseln having a high voltage.

In an embodiment, each block decoder 1210 forwards a block select signal to the block decoder for its neighbor blocks. The neighbor blocks refers to the physical location of the blocks in the memory structure. Note that the physical relationship between the blocks of memory cells may differ from the physical relationship of the block decoders. However, in the example in FIG. 12, the block decoders are physically arranged similar to how the blocks are physically arranged.

The following example will be used to describe how the logic in FIG. 12 may be operated. For the sake of example, BLKn+1 is the selected block for programming. Therefore, BLKn and BLKn+2 are neighbor unselected blocks for which SGS should receive VSS (note that VSS is an example voltage that will keep the SGS gates off). In this example, the other unselected blocks (BLKn−1, BLKn+3) should have SGS floated. The SGS logic 1204 in each block decoder is configured to have the SGS switch 1206 apply VSS to the SGS line if either neighbor block is selected. If neither neighbor block is selected then the SGS logic 1204 will have the SGS switch 1206 float the SGS line. The BLK_sel logic 1202 in BD BLKn+1 generates a block select signal that indicates whether its block has been selected. For example, BLKsel is high and BLKseln is low when the block has been selected. At least one of these block select signals is forwarded to each neighbor block decoder (BD BLKn, BD BLKn+2). An example will be discussed in which the active low BLKseln is forward, but alternatively the active high BLKsel could be forwarded. The SGS logic 1204 in BD BLKn receives the BLKseln from BD BLKn+1 and interprets this as a signal to have the SGS switch 1206 apply VSS to the SGS line in the block associated with BD BLK. Likewise, the SGS logic 1204 in BD BLKn+2 receives the BLKseln from BD BLKn+1 and interprets this as a signal to have the SGS switch 1206 apply VSS to the SGS line in the block associated with BD BLKn+2. The SGS logic 1204 in BD BLKn also receives the BLKseln from BD BLKn−1, which indicates that BLKn−1 has not been selected. However, since the other neighbor block BLKn+1 was selected the SGS logic 1204 ignores the BLKseln from BD BLKn−1. The SGS logic 1204 in BD BLKn−1 will instruct its SGS switch 1206 to float the SGS line in its associated block because it does not receive any block select signals indicating a neighbor block has been selected. Likewise, SGS logic 1204 in BD BLKn+3 will instruct its SGS switch 1206 to float the SGS line in its associated block because it does not receive any block select signals indicating a neighbor block has been selected.

Figure 13:
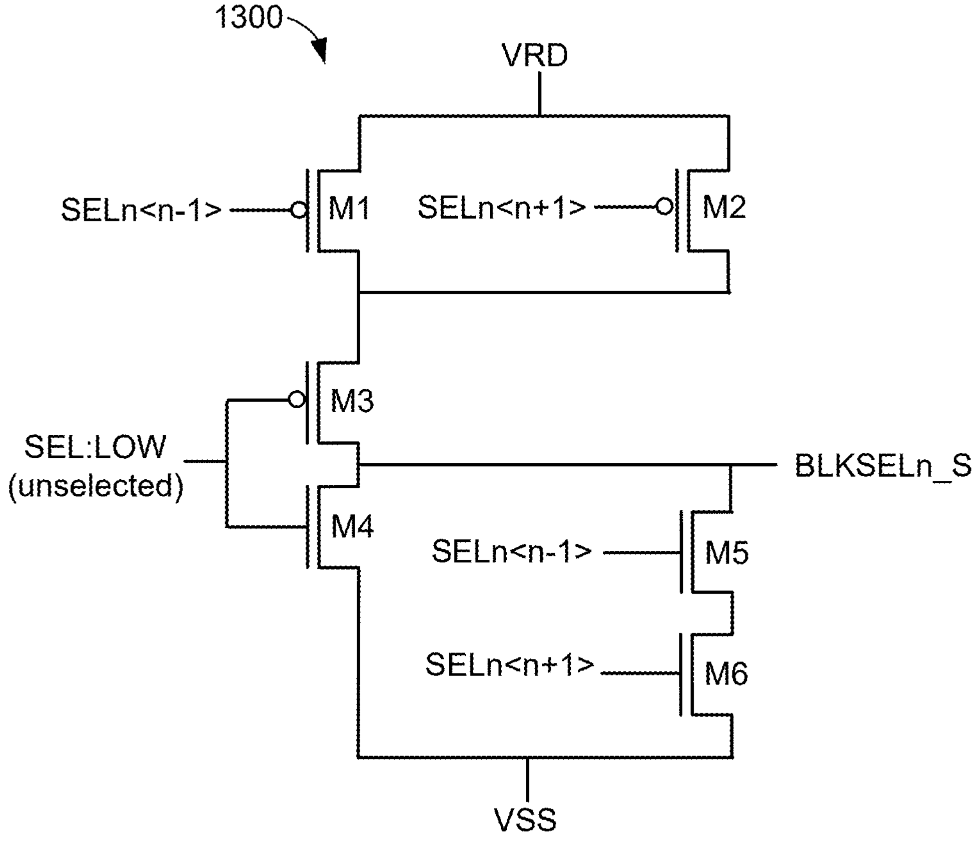
FIG. 13 is a schematic diagram of one embodiment of a circuit within the SGS logic.

FIG. 13 is a schematic diagram of one embodiment of a circuit 1300 within the SGS logic 1204. The circuit 1300 is for use with a block referred to as BLKn. The circuit 1300 inputs a first block select SELn<n−1> that indicates whether one neighbor has been selected and a second block select SELn<n+1> that indicates whether another neighbor has been selected. These block select signals may be forwarded from a neighbor. However, as will be described below, the block select signals could be generated by a dummy circuit within the block decoder for BLKn. For this circuit configuration each of these block select signals are active low. SELn<n−1> is input to the gates of M1 and M5. SELn<n+1> is input to the gates of M2 and M6. The circuit 1300 also inputs an active low block select signal for BLKn (SEL). SEL is provided to the gates of M3 and M4. In this example, SEL is LOW because BLKn is presently unselected. The circuit 1300 outputs a signal BLKSELn_S, which is used to control an SGS switch 1206. The signal BLKSELn is used to control whether the SGS switch provides VSS to the SGS line or floats the SGS line. In an embodiment, BLKSELn is at about VRD to turn on an SGS switch to pass VSS to the SGS line. When SEL is LOW, M3 will be on and M4 will be off. If SELn<n−1> is low, then M1 is on to pass VRD to BLKSELn_S. If SELn<n+1> is low, then M2 is on to pass VRD to BLKSELn_S. When BLKSELn_S is at VRD, the SGS switch passes VSS to the SGS line. If SELn<n−1> and SELn<n+1> are both high (neither neighbor selected), then VSS will be passed to BLKSELn_S. If BLKSELn_S is at VSS then the SGS line will be floated.

Figure 14:
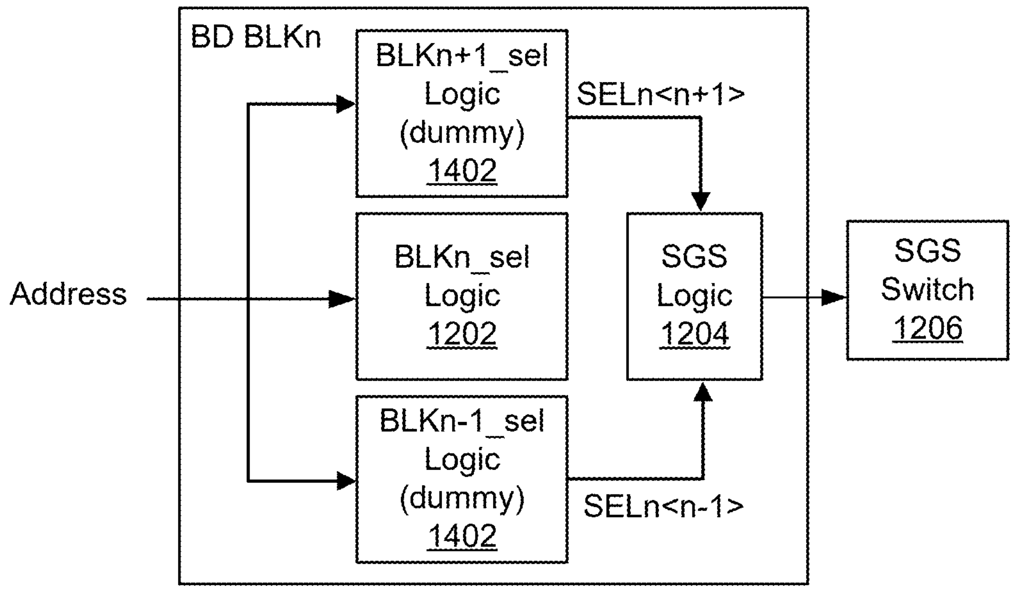
FIG. 14 is a block diagram of an embodiment of a block decoder BD BLKn having two dummy block select logics.

In some architectures it might not be convenient to pass the block select signal from one block decoder to another. In another embodiment, a block decoder for BLKn will generate a block select signal that is associated with a neighbor block (e.g., BLKn−1 and/or BLKn+1). This block select signal may then be used in a similar manner as the previously discussed forwarded block select signal to control the SGS switch. FIG. 14 is a block diagram of an embodiment of a block decoder BD BLKn having two dummy block select logics 1402. One dummy block select logic 1402 is used to generate a block select signal for BLKn+1 (SELn<n+1>) in response to the Address. The other dummy block select logic 1402 is used to generate a block select signal for BLKn−1 (SELn<n−1>) in response to the Address. Also depicted is the normal block select logic 1202, which is used to generate a block select signal for BLKn in response to the Address. The SGS logic 1204 in FIG. 14 may be implemented with the circuit 1300 of FIG. 13. Note that the Address depicted in FIG. 14 may be provided on a set of address lines. However, different address lines may be provided to the each of BLKn+1 select logic, BLKn sel logic, and BLKn−1 sel logic. Each of these select logics is configured to determine whether the address provided to it matches the address for the corresponding block.

Figure 15:
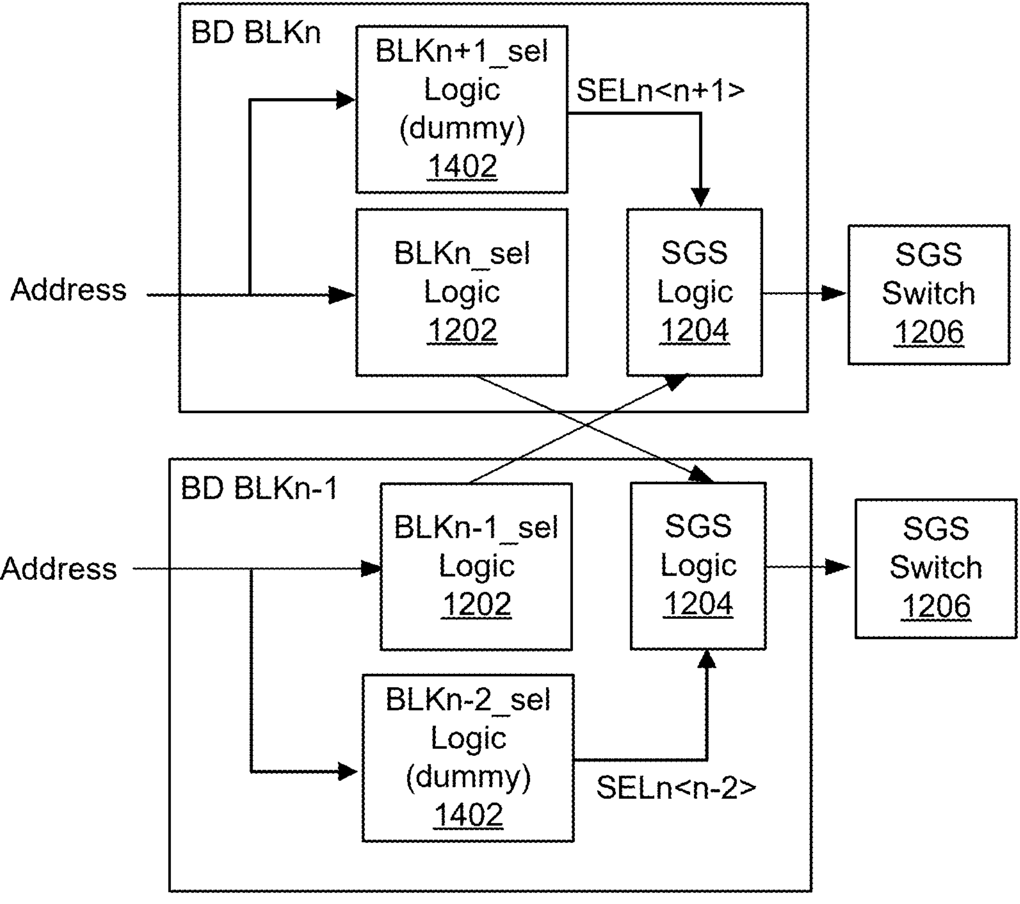
FIG. 15 shows a block diagram of an embodiment of block decoders that may be used to control SGS switches.

The forwarding technique shown and described with respect to FIG. 12 may be combined with the dummy block select logic technique shown and described with respect to FIG. 14. FIG. 15 shows a block diagram of an embodiment of block decoders that may be used to control SGS switches. Each block decoder has only a single dummy block select logic 1402. In this example, the BLKn+1 dummy block select logic 1402 in block decoder BD BLKn generates block select signal SELn<n+1>, which is the block select signal associated with BLKn+1 (not depicted in FIG. 15). Block select signal SELn<n+1> is one input to the SGS logic

1204 in BD BLKn. The other block select signal that is input to the SGS logic 1204 in BD BLKn is forwarded from the BLKn−1_sel logic 1202 in BD BLKn−1. Therefore, SGS logic 1204 is able to cause the SGS switch 1206 to output VSS to the SGS line if either neighbor block to BLKn is selected. The block decoder for BLKn−1 operates in a similar manner.

FIG. 16 depicts an embodiment of a layout of control circuitry. In one embodiment the control circuitry resides on the memory die 200. In one embodiment the control circuitry resides on the control die 211. The control circuitry includes a block decoder (BD 0-BD n) for each block in a plane. The control circuitry includes a set of word line switches (WLSW 0-WLSW n) for each block in the plane. The word line switches include switches for both the word lines and the select lines (e.g., SGD, SGS). The block decoders and word line switches may reside in the row control circuitry 220. Additionally, the control circuitry includes what is referred to as "peripheral circuitry" 1602. The peripheral circuitry 1602 may include, but is not limited to, system control logic 260 and column control circuitry 210 (including read/write circuits 225). The layout in FIG. 16 shows the relative physical locations of the block decoders. Note that block decoders for even numbered blocks are on one side of the peripheral circuitry 1602 and block decoders for odd numbered blocks are on the other side of the peripheral circuitry 1602. Referring back to FIG. 4A, one organization of the blocks in a plane is for odd numbered blocks to alternate with the even numbered blocks. Therefore, the technique discussed with respect to FIG. 12 of a block decoder forwarding its block select signal to a block decoder for a neighbor block would require the block select signal to be forwarded across the peripheral circuitry 1602. Hence the technique depicted in FIG. 14 that has the dummy block select logic 1402 may be used to avoid such forwarding of block select signals across the peripheral circuitry 1602. For example, BD 2 can have dummy block select logic for generating block select signals for BLK 1 and BLK 3.

FIG. 17 depicts another embodiment of a layout of control circuitry. In one embodiment the control circuitry resides on the memory die 200. In one embodiment the control circuitry resides on the control die 211. In the example in FIG. 17 the block decoders are numbered from BD1 to BD 4*n*, corresponding to 4*n* blocks in the plane. Likewise, the word line switches are numbered from WLSW 1 to WLSW 4*n*, corresponding to 4*n* blocks in the plane. The peripheral circuitry is divided into first peripheral circuitry 1702*a* on one side of the BD/WLSW circuitry and second peripheral circuitry 1702*b* on the other side of the BD/WLSW circuitry. In this example there are some block decoders that are next to a block decoder for a neighbor block. For example, BD2 is next to BD3. Therefore, a block decode signal can be efficiently forwarded between these two block decoders. Thus one option is to use the forwarding technique shown in FIG. 12 for such block decoders. However, the technique shown in FIG. 14 could also be used for blocks such as BD 2 and BD 3. On the other hand, block decoders such as BD 3 and BD 4 are separated by word line switches. In an embodiment, a block decoder such as BD 3 will generate the block select signal associated with BLK 4 to avoid routing the block select signal across the word line switch region. Similarly, block decoder such as BD 4 will generate the block select signal associated with BLK 3 to avoid routing the block select signal across the word line switch region.

Figure 18:
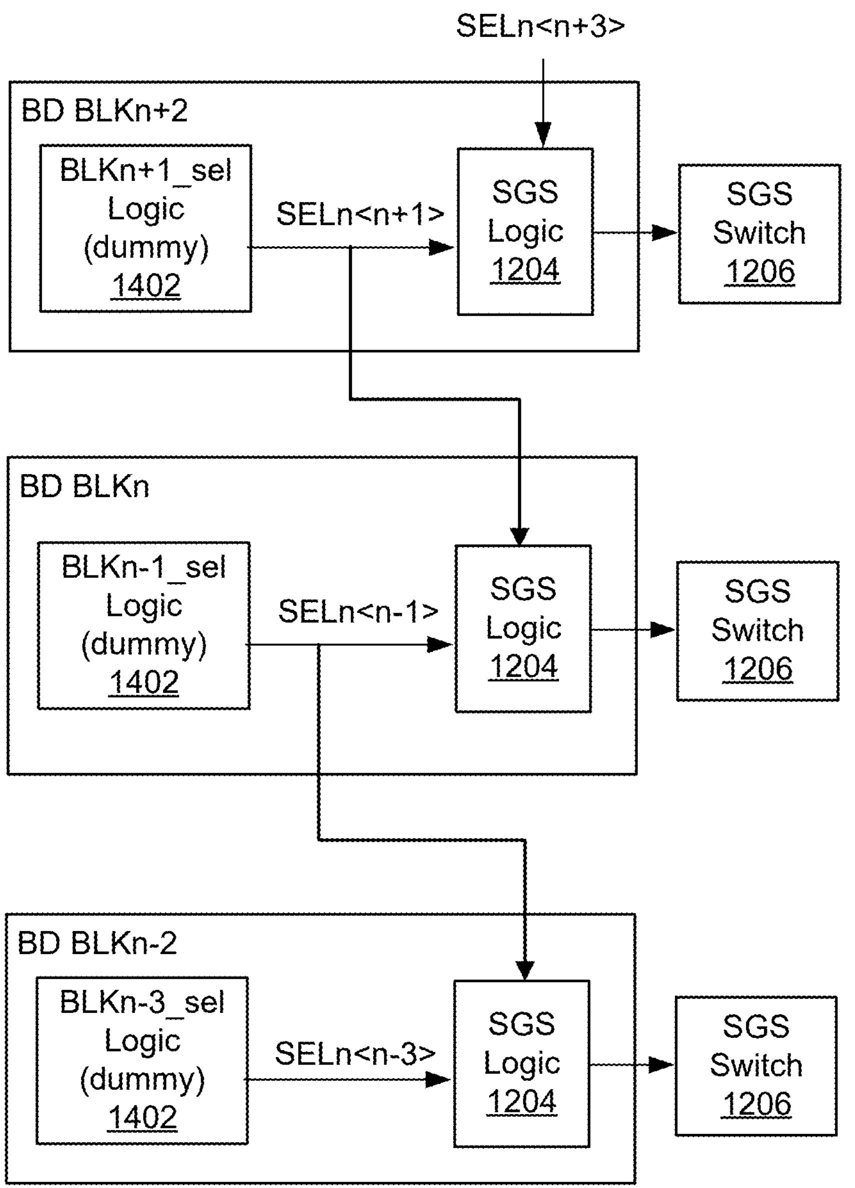
FIG. 18 depicts further details of an embodiment of a combination of using dummy select logic and forwarding of block select signals.

FIG. 18 depicts further details of an embodiment of a combination of using dummy select logic and forwarding of block select signals. In this example, block decoders for even numbered blocks are next to each other. Each of these even numbered block decoders has a dummy block select logic 1402 for a block having an odd number one less than the even number. For example, BD BLKn+2 has a dummy block select logic 1402 for BLKn+1, BD BLKn has a dummy block select logic 1402 for BLKn−1, and BD BLKn−2 has a dummy block select logic 1402 for BLKn−3. Each block select signals may be used both within the block decoder and forwarded to another block decoder. For example, BD BLKn generates SELn<n−1> using BLKn−1 dummy selection logic 1402 and receives SELn<n+1> from BD BLKn+1 dummy selection logic 1402 in BD BLKn+2. Therefore, the SGS logic 1402 in BD BLKn receives the block select signals associated with two neighbor blocks, as has been previously discussed (see FIG. 13). The other even numbered block decoders operate in a similar manner.

Some examples have been presented herein in which the SGS lines in two neighbor blocks are biased to, for example, VSS with SGS lines in remaining blocks floating. However, more than two neighbor blocks can have their SGS lines biased to VSS. FIG. 19A-19E are schematic diagrams of examples of dummy block selection logic 1402. Each of these circuits is capable of generating neighbor block select signals, but for a different number of neighbors. As will be explained below each dummy block selection logic 1402 inputs a different configuration of address signals.

Each dummy block selection logic 1402 has Transistors T1, T2, T3, and T4. A row decode signal (RDEC) is applied to the gate of T1. The block select signal (SELn<n−1>) may be taken from the gates of T3/T4. Note that in FIG. 19A-19E, SELn<n−1> refers to a set of neighbor blocks on one side of BLKn.

Figure 19A:
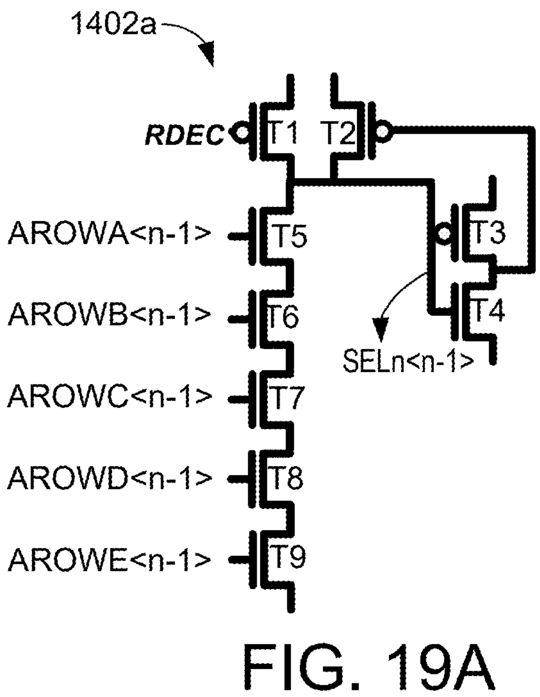
FIG. 19A-19E are schematic diagrams of examples of dummy block selection logic.

With reference now to FIG. 19A, this dummy block selection logic 1402*a* may be used to generate a block select signal for a single neighbor block (e.g., BLKn−1). A similar circuit may be used to generate a block select signal for a neighbor block (e.g., BLKn+1) on the other side of BLKn. The dummy block selection logic 1402*a* determines whether the input address matches the address for BLKn−1. The Address signal is divided into five portions. AROWA may have eight lines, one of which is input to T5. Note that the determination of which of the eight lines is input to T5 depends on the address of the block for which the block select signal is being generated. AROWB may have four lines, one of which is input to T6. AROWC may have four lines, one of which is input to T7. AROWD may have four lines, one of which is input to T8. AROWE may have four lines, one of which is input to T9. The address lines that are input to T5-T9 are the ones needed to turn on each of T5-T9 if the address on the lines matches the address of BLKn−1 (e.g., AROWA<n−1> refers the address line for AROWA corresponding to the address of BLKn−1).

Figure 19B:
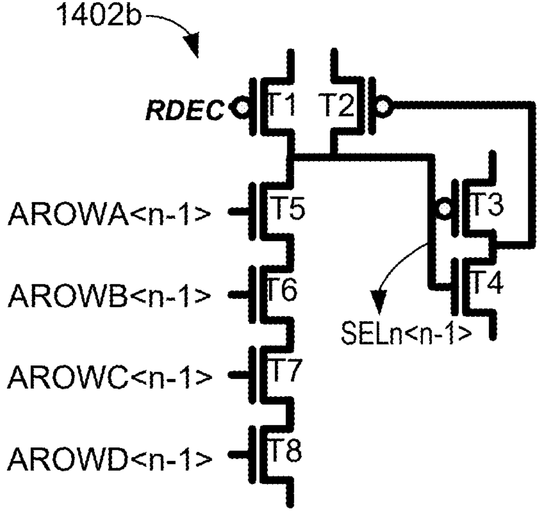

FIG. 19B is an embodiment of a dummy block selection logic 1402*b* that may be used for two neighbors on one side of BLKn. The dummy block selection logic 1402*b* is similar to the dummy block selection logic 1402*a*, but omits T9. Therefore, AROWE is not used for dummy block selection logic 1402*b*.

Figure 19C:
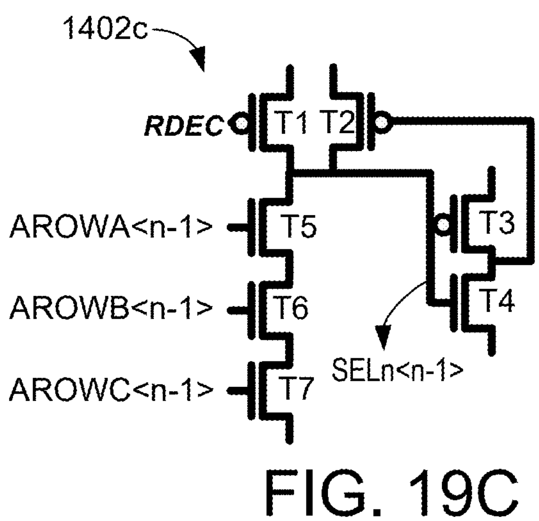

FIG. 19C is an embodiment of a dummy block selection logic 1402*c* that may be used for eight neighbors on one side of BLKn. The dummy block selection logic 1402*c* is similar to the dummy block selection logic 1402*b*, but omits T8. Therefore, neither AROWD nor AROWE are used for dummy block selection logic 1402*c*.

Figure 19D:
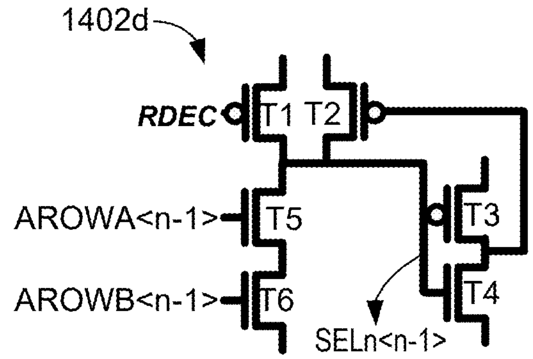

FIG. 19D is an embodiment of a dummy block selection logic 1402*d* that may be used for 32 neighbors on one side of BLKn. The dummy block selection logic 1402*d* is similar to the dummy block selection logic 1402*c*, but omits T7. Therefore, none of AROWC, AROWD nor AROWE are used for dummy block selection logic 1402*d*.

Figure 19E:
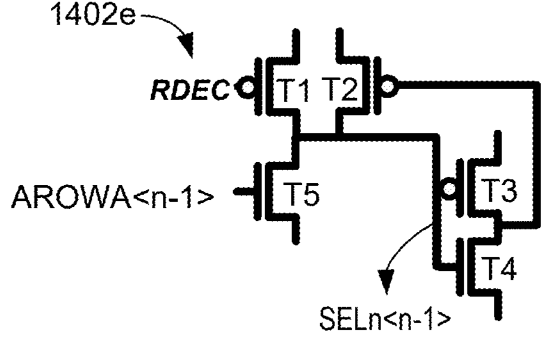

FIG. 19E is an embodiment of a dummy block selection logic 1402*e* that may be used for 128 neighbors on one side of BLKn. The dummy block selection logic 1402*e* is similar to the dummy block selection logic 1402*d*, but omits T6. Therefore, none of AROWB, AROWC, AROWD nor AROWE are used for dummy block selection logic 1402*e*.

In view of the foregoing, an embodiment includes an apparatus comprising one or more control circuits configured to connect to a three-dimensional memory structure. The memory structure has a plane having a plurality of blocks and a source line. Each block comprises NAND strings, word lines associated with the NAND strings, and a source side select line associated with the NAND strings. The one or more control circuits are configured to apply a first voltage to the source side select line in a first set of one or more unselected blocks in the plane physically adjacent to a selected block in the plane. The one or more control circuits are configured to float the source side select lines in a second set of remaining unselected blocks in the plane. The one or more control circuits are configured to apply a second voltage to the source line in the plane. The first voltage applied to the source side select lines in the first set of unselected blocks keeps source side select transistors in the first set of unselected blocks off while the source line is at the second voltage. The one or more control circuits are configured to apply a program voltage to a selected word line in the selected block while applying the first voltage to the source side select lines in the first set of unselected blocks, floating the source side select lines in the second set of unselected blocks and the applying the second voltage to the source line.

In a further embodiment of the apparatus, the one or more control circuits are further configured to raise a voltage on the source line to the second voltage while floating the source side select lines in the second set of unselected blocks in the plane.

In a further embodiment of the apparatus, the one or more control circuits are further configured to apply the first voltage to the source side select line in the first set of unselected blocks while raising the voltage on the source line to the second voltage.

In a further embodiment of the apparatus, the one or more control circuits are further configured to ground a drain side select line in the unselected blocks in the plane and float word lines in the unselected blocks in the plane while applying the program voltage to the selected word line in the selected block.

In a further embodiment of the apparatus, the one or more control circuits comprise a plurality of block decoders. The block decoder for a particular block comprises a circuit configured to receive a block select signal from a block decoder for each of one or more neighbor blocks to the particular block. And the circuit is configured to control a source line switch to pass the first voltage to the source side select line in the particular block responsive to any of the block select signals indicating any of the one or more neighbor blocks were selected for a program operation in which the program voltage is applied to the selected word line.

In a further embodiment of the apparatus, the circuit in the block decoder for the particular block is further configured to control the source line switch to float the source side select line in the particular block responsive to the block select signals indicating none of the one or more neighbor blocks were selected for the program operation.

In a further embodiment of the apparatus, the one or more control circuits comprises a plurality of block decoders. The block decoder for a particular block comprises a circuit configured to generate a block select signal responsive to a neighbor block being selected for a program operation in which the program voltage is applied to the selected word line. And the circuit is configured to apply the block select signal to a source side select line switch to pass the first voltage to the source side select line in the particular block.

In a further embodiment of the apparatus, the one or more control circuits comprises a plurality of block decoders. The block decoder for a particular block comprises a circuit configured to generate a block unselect signal responsive to no neighbor blocks being selected for the program operation. And the circuit is configured to apply the block unselect signal to the source side select line switch to float the source side select line.

In a further embodiment of the apparatus, the circuit in the block decoder for the particular block comprises a dummy decoder configured to generate the block select signal responsive to an address signal matching the address of the neighbor block.

In a further embodiment of the apparatus, the first set of the one or more unselected blocks in the plane consist of a first unselected block on a first side of the selected block and a second unselected block on a second side of the selected block.

In a further embodiment of the apparatus, the first set of the one or more unselected blocks in the plane comprise of a first plurality of unselected blocks on a first side of the selected block and a second plurality of unselected blocks on a second side of the selected block.

An embodiment includes a method for programming NAND memory. The method comprises applying a first voltage to source side select lines in a first set of unselected blocks in a plane in the NAND memory. The first set is physically adjacent to a selected block in the plane. The method comprises floating source side select lines in a second set of unselected blocks in the plane in the NAND memory. The second set of unselected blocks being the remaining unselected blocks other than the first set of unselected blocks. The method comprises applying a second voltage to a source line in the plane while applying the first voltage to the source side select lines in the first set of unselected blocks and while floating the source side select lines in the second set of unselected blocks. Source side select transistors connected to the source side select lines in the first set of unselected blocks are non-conductive. The method comprises applying a program voltage to a selected word line in the selected block while applying the first voltage to the source side select lines in the first set of unselected blocks, floating the source side select lines in the second set of unselected blocks, and applying the second voltage to the source line.

An embodiment includes a non-volatile storage device, comprising a plane comprising a source line and a plurality of blocks and one or more control circuits in communication with the plane. Each block comprises NAND strings, word lines associated with the NAND strings in the block, and a source side select line associated with the NAND strings in the block. The one or more control circuits are configured to apply a first voltage to the source side select lines in a first set of unselected blocks in a plane in the non-volatile storage device. The first set being physically adjacent to a selected block in the plane. The one or more control circuits are configured to float source side select lines in a second set of unselected blocks in the plane in the non-volatile storage device. The one or more control circuits are configured to raise a voltage on the source line in the plane to a second voltage while floating the source side select lines in the second set of unselected blocks. The one or more control circuits are configured to apply a program voltage to a selected word line in the select block while applying the first voltage to the source side select lines in the first set of unselected blocks, floating the source side select lines in the second set of unselected blocks, and applying the second voltage to the source line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to connect to a three-dimensional memory structure, the memory structure having a plane having a plurality of blocks and a source line, each block comprising NAND strings, word lines associated with the NAND strings, and a source side select line associated with the NAND strings, the one or more control circuits configured to:

apply a first voltage to the source side select line in a first set of one or more unselected blocks in the plane physically adjacent to a selected block in the plane;

float the source side select lines in a second set of remaining unselected blocks in the plane;

apply a second voltage to the source line in the plane, wherein the first voltage applied to the source side select lines in the first set of unselected blocks keeps source side select transistors in the first set of unselected blocks off while the source line is at the second voltage; and apply a program voltage to a selected word line in the selected block while applying the first voltage to the source side select lines in the first set of unselected blocks, floating the source side select lines in the second set of unselected blocks and applying the second voltage to the source line.

2. The apparatus of claim 1, wherein the one or more control circuits are further configured to:

raise a voltage on the source line to the second voltage while floating the source side select lines in the second set of unselected blocks in the plane.

3. The apparatus of claim 2, wherein the one or more control circuits are further configured to:

apply the first voltage to the source side select line in the first set of unselected blocks while raising the voltage on the source line to the second voltage.

4. The apparatus of claim 1, wherein the one or more control circuits are further configured to:

ground a drain side select line in the unselected blocks in the plane and float word lines in the unselected blocks in the plane while applying the program voltage to the selected word line in the selected block.

5. The apparatus of claim 1, wherein the one or more control circuits comprise a plurality of block decoders, wherein the block decoder for a particular block comprises a circuit configured to:

receive a block select signal from a block decoder for each of one or more neighbor blocks to the particular block; and control a source line switch to pass the first voltage to the source side select line in the particular block responsive to any of the block select signals indicating any of the one or more neighbor blocks were selected for a program operation in which the program voltage is applied to the selected word line.

6. The apparatus of claim 5, wherein the circuit in the block decoder for the particular block is further configured to:

control the source line switch to float the source side select line in the particular block responsive to the block select signals indicating none of the one or more neighbor blocks were selected for the program operation.

7. The apparatus of claim 1, wherein the one or more control circuits comprises a plurality of block decoders, wherein the block decoder for a particular block comprises a circuit configured to:

generate a block select signal responsive to a neighbor block being selected for a program operation in which the program voltage is applied to the selected word line; and apply the block select signal to a source side select line switch to pass the first voltage to the source side select line in the particular block.

8. The apparatus of claim 7, wherein the one or more control circuits comprises a plurality of block decoders, wherein the block decoder for a particular block comprises a circuit configured to:

generate a block unselect signal responsive to no neighbor blocks being selected for the program operation; and apply the block unselect signal to the source side select line switch to float the source side select line.

9. The apparatus of claim 7, wherein the circuit in the block decoder for the particular block comprises a dummy decoder configured to generate the block select signal responsive to an address signal matching the address of the neighbor block.

10. The apparatus of claim 1, wherein the first set of the one or more unselected blocks in the plane consist of a first unselected block on a first side of the selected block and a second unselected block on a second side of the selected block.

11. The apparatus of claim 1, wherein the first set of the one or more unselected blocks in the plane comprise of a first plurality of unselected blocks on a first side of the selected block and a second plurality of unselected blocks on a second side of the selected block.

12. A method for programming NAND memory, the method comprising:

applying a first voltage to source side select lines in a first set of unselected blocks in a plane in the NAND memory, the first set being physically adjacent to a selected block in the plane;

floating source side select lines in a second set of unselected blocks in the plane in the NAND memory, the second set of unselected blocks being the remaining unselected blocks other than the first set of unselected blocks;

applying a second voltage to a source line in the plane while applying the first voltage to the source side select lines in the first set of unselected blocks and while floating the source side select lines in the second set of unselected blocks, wherein source side select transistors connected to the source side select lines in the first set of unselected blocks are non-conductive; and applying a program voltage to a selected word line in the selected block while applying the first voltage to the source side select lines in the first set of unselected blocks, floating the source side select lines in the second set of unselected blocks, and applying the second voltage to the source line.

13. The method of claim 12, further comprising:

forwarding a block select signal from a block decoder for the selected block to a block decoder for a first unselected block in the first set of unselected blocks; and applying the first voltage to the source side select line in the first unselected block in response to the block select signal.

14. The method of claim 12, further comprising:

generating a block select signal in a block decoder for a first unselected block in the first set of unselected blocks in response to an address signal having an address that matches the selected block; and applying the first voltage to the source side select line in the first unselected block in response to the block select signal.

15. The method of claim 12, further comprising:

receiving a first block select signal from a first block decoder at a second block decoder for a first unselected block in the first set of unselected blocks, the first block select signal being for a first neighbor block that neighbors the first unselected block;

generating a second block select signal in the second block decoder in response to an address signal having an address that matches an address of a second neighbor block that neighbors the first unselected block; and applying the first voltage to the source side select line in the first unselected block in response to either the first block select signal indicating that the first neighbor block is selected for the program operation or the second block select signal indicating that the second neighbor block is selected for a program operation in which the program voltage is applied to the selected word line.

16. A non-volatile storage device, comprising:

a plane comprising a source line and a plurality of blocks, each block comprising NAND strings, word lines associated with the NAND strings in the block, and a source side select line associated with the NAND strings in the block; and one or more control circuits in communication with the plane, the one or more control circuits configured to:

apply a first voltage to the source side select lines in a first set of unselected blocks in a plane in the non-volatile storage device, the first set being physically adjacent to a selected block in the plane;

float source side select lines in a second set of unselected blocks in the plane in the non-volatile storage device;

raise a voltage on the source line in the plane to a second voltage while floating the source side select lines in the second set of unselected blocks; and apply a program voltage to a selected word line in the select block while applying the first voltage to the source side select lines in the first set of unselected blocks, floating the source side select lines in the second set of unselected blocks, and applying the second voltage to the source line.

17. The non-volatile storage device of claim 16, wherein the one or more control circuits are further configured to:

apply the first voltage to the source side select line in the first set of unselected blocks while raising the voltage on the source line to the second voltage.

18. The non-volatile storage device of claim 16, wherein the one or more control circuits are further configured to:

receive a first block select signal from a first block decoder for a first neighbor block, the first block select signal indicating whether the first neighbor block to a first unselected block in the first set has been selected for a program operation in which the program voltage is applied to the selected word line;

receive a second block select signal from a second block decoder for a second neighbor block, the second block select signal indicating whether the second neighbor block to the first unselected block has been selected for the program operation; and control a source line switch to pass the first voltage to the source side select line in the first unselected block responsive either the first block select signal indicating that the first neighbor block has been selected for the program operation or the second block select signal indicating that the second neighbor block has been selected for the program operation.

19. The non-volatile storage device of claim 16, wherein the one or more control circuits comprises a block decoder for a first unselected block in the first set that is configured to:

generate a first block select signal for a first neighbor block, the first block select signal indicating whether the first neighbor block to the first unselected block in the first set has been selected for a program operation in which the program voltage is applied to the selected word line;

generate a second block select signal for a second neighbor block, the second block select signal indicating whether the second neighbor block to the first unselected block has been selected for the program operation; and control a source line switch to pass the first voltage to the source side select line in the first unselected block responsive either the first block select signal indicating that the first neighbor block has been selected for the program operation or the second block select signal indicating that the second neighbor block has been selected for the program operation.

20. The non-volatile storage device of claim 16, wherein the one or more control circuits comprises a block decoder for a first unselected block in the first set that is configured to:

generate a first block select signal for a first neighbor block, the first block select signal indicating whether the first neighbor block to the first unselected block in the first set has been selected for a program operation in which the program voltage is applied to the selected word line;

receive a second block select signal from a block decoder for a second neighbor block, the second block select signal indicating whether the second neighbor block to the first unselected block has been selected for the program operation; and control a source line switch to pass the first voltage to the source side select line in the first unselected block responsive either the first block select signal indicating that the first neighbor block has been selected for the program operation or the second block select signal indicating that the second neighbor block has been selected for the program operation.

* * * * *